United States Patent [19]

Abe et al.

[11] Patent Number: 5,285,080
[45] Date of Patent: Feb. 8, 1994

[54] METHOD OF SELECTIVE LIGHT DETECTION

[75] Inventors: Yuji Abe; Yasunori Tokuda, both of Amagasaki, Japan

[73] Assignee: Mitsubishi Denki Kabushiki Kaisha, Tokyo, Japan

[21] Appl. No.: 853,085

[22] Filed: Mar. 17, 1992

[30] Foreign Application Priority Data

Mar. 29, 1991 [JP] Japan .................. 3-066408

[51] Int. Cl.$^5$ .......................... H01L 29/161
[52] U.S. Cl. ........................ 257/23; 257/21; 257/85; 257/184
[58] Field of Search ............ 257/13, 14, 21, 23, 257/85, 97, 184

[56] References Cited

U.S. PATENT DOCUMENTS

| 4,205,331 | 5/1980 | Esaki et al. |
|---|---|---|
| 4,800,262 | 1/1989 | Lentine ................ 257/23 |
| 4,833,511 | 5/1989 | Sugimoto ............. 257/13 |
| 4,843,439 | 6/1989 | Chang . |
| 5,097,306 | 3/1992 | Tokuda ................ 357/30 |
| 5,144,397 | 9/1992 | Tokuda et al. ........ 257/14 |

FOREIGN PATENT DOCUMENTS

| 55-93275 | 7/1980 | Japan . |
|---|---|---|
| 2-170581 | 7/1990 | Japan ................ 257/21 |

OTHER PUBLICATIONS

Larsson et al., "High Speed Dual-Wavelength Demultiplexing and Detection in a Monolithic Superlattice p-i-n Waveguide Detector array", *Applied Physics Letters*, 49 (5), Aug. 1986, pp. 233-235.

Tokuda et al, "Self-Deformed And Hysteretic Photocurrent Spectra Of Quantum Wells With A Load Resistor", Applied Physics Letters, vol. 54, No. 23, Jun. 1989, pp. 2324-2326.

Miller et al, "The Quantum Well Self-Electrooptic Effect Device: Optoelectronic Bistability And Oscillation, And Self-Linearized Modulation", IEEE Journal of Quantum Electronics, vol. QE-21, No. 9, Sep. 1985, pp. 1462-1476.

*Primary Examiner*—Edward Wojciechowicz
*Assistant Examiner*—Courtney A. Bowers
*Attorney, Agent, or Firm*—Leydig, Voit & Mayer

[57] ABSTRACT

A method of selective light detection uses an optical multi-stable device selectively exhibiting a variety of optical multi-stable characteristics for incident light wavelengths or intensities. The device includes an optically serial connection of two optical bistable elements. Each of the optical bistable elements includes a photodiode having a light absorbing layer including a quantum well structure. The photodiodes are reverse biased by respective voltage sources through respective series resistors so that an optical bistable characteristic for incident light wavelength or intensity is achieved for each photodiode. The characteristic of the second photodiode includes four stable photocurrents at respective wavelengths.

9 Claims, 32 Drawing Sheets

WAVELENGTH →

METHOD OF SELECTIVE LIGHT DETECTION

This invention relates to an optical multi-stable device for use in optical information processing systems, such as an optical computer, and more particularly to an optical multi-stable device and method which may be used as, for example, a logic device and a memory device in optical information processing systems.

BACKGROUND OF THE INVENTION

FIG. 1 is a generalized diagram of an optical bistable element using a conventional p-i-n photodiode described by David A. B. Miller et al., in IEEE Journal of Quantum Electronics, QE-21, No. 9, September 1985, Pages 1462-1476. A p-i-n photodiode 20 comprises an AlGaAs/GaAs multiple quantum well layer 1, undoped AlGaAs layers 31 and 32 respectively disposed on the opposed surfaces of the multiple quantum well layer 1, a p-type AlGaAs layer 4 disposed the undoped AlGaAs layer 31, an n-type AlGaAs layer 5 disposed on the undoped AlGaAs layer 32, and electrodes 82 and 81 respectively disposed on the p-type and n-type AlGaAs layers 4 and 5. An external voltage source 11 providing a voltage Vex is coupled between the electrodes 81 and 82 through an external resistor 9 having a resistance value of R. The external voltage source 11 is connected to reverse bias the p-i-n diode 20.

The operation of the optical bistable device using the p-i-n diode 20 shown in FIG. 1 is explained with reference to FIGS. 2 and 3.

The reverse bias voltage Vex is applied through the external resistor 9 to the p-i-n photodiode 20. The multiple quantum well layer 1 within the photodiode exhibits a sharp peak in the absorption spectrum due to exciton absorption corresponding to quantum level transitions. The peak in the absorption spectrum can be shifted by changing the internal electric field. In other words, the peak absorption coefficient at a given incident light wavelength depends on the internal electric field.

Light incident on the photodiode 20 is absorbed by the multiple quantum well layer 1 and corresponding photocurrent I is generated. FIG. 2 shows relationship of the light absorption coefficient of the photodiode 20 to a voltage applied to the photodiode 20. It is seen that the light absorption coefficient is at a peak when the voltage applied to the photodiode 20 is at a particular value. In the arrangement shown in FIG. 1, a voltage drop occurs across the external resistor 9 due to the photocurrent I, which causes the voltage V applied to the photodiode to change from Vex to Vex—IR. The relationship between the photocurrent I and the absorption coefficient S can be expressed as:

$$I = \alpha S P_{in} \quad (1)$$

where $\alpha$ is a constant, and $P_{in}$ is an incident light intensity. From this, the absorption coefficient is expressed as:

$$S = (Vex - V)\alpha R P_{in} \quad (2)$$

Thus, the absorption coefficient S may be represented by a line with a slope which decreases as the intensity of incident light $P_{in}$ increases. In FIG. 2, lines A-D are lines which can be expressed by the equation (2) for different intensities $P_{in}$ of incident light. An actual operating point is at an intersection of this line with the curve showing the relationship between the voltage V applied to the photodiode 20 and the light absorption coefficient S of the photodiode 20.

As will be understood from FIG. 2, the lines A and D intersect the curve representing the absorption coefficient S at only one point, but lines lying between the lines B and C intersect the curve at three points. The central one of the three points is an unstable point, and the remaining two are stable points. That is, the element having those lines which lie between the lines B and C are bistable.

In FIG. 3, relationships of the output light intensity $P_{out}$ to the incident light intensity $P_{in}$ in is shown. Bistability is exhibited within a range of the incident light intensity $P_{in}$. Specifically, as the intensity of incident light increases, the output light intensity abruptly decreases at a certain value of the incident light intensity, and when the incident light intensity is decreased from a value larger than the value at which the abrupt decrease of the output light intensity occurs, the output light intensity will increase abruptly at a certain value of the incident light intensity, as shown in FIG. 3.

However, conventional techniques cannot provide optical bistable elements in which the output light intensity $P_{out}$ abruptly increases at a first value of the incident light intensity $P_{in}$ as the incident light intensity is increased, and abruptly decreases at a second value of the incident light intensity $P_{in}$ as the incident light intensity is decreased.

Since conventional optical bistable elements have such characteristics as stated above, it is difficult to provide an optical multi-stable characteristic having three or more stable points. Furthermore, more than one optical stability characteristic cannot be obtained.

An object of the present invention is to provide an optical multi-stable device which can exhibit a plurality of optical multi-stable characteristics for an incident light wavelength or an incident light intensity.

SUMMARY OF THE INVENTION

According to the present invention, a p-i-n diode including a quantum well structure is connected in series with an external resistor in such a manner that the series connection exhibits optical bistability for an incident light wavelength or incident light intensity. A plurality of such series connections are optically connected in series with each other.

By virtue of optical series connection of a number of elements exhibiting an optical bistable characteristic for an incident light wavelength or incident light intensity, a number of optical multi-stable characteristics for the incident light wavelength or intensity are provided.

DETAILED DESCRIPTION OF EMBODIMENT

Example 1

Figure 4:
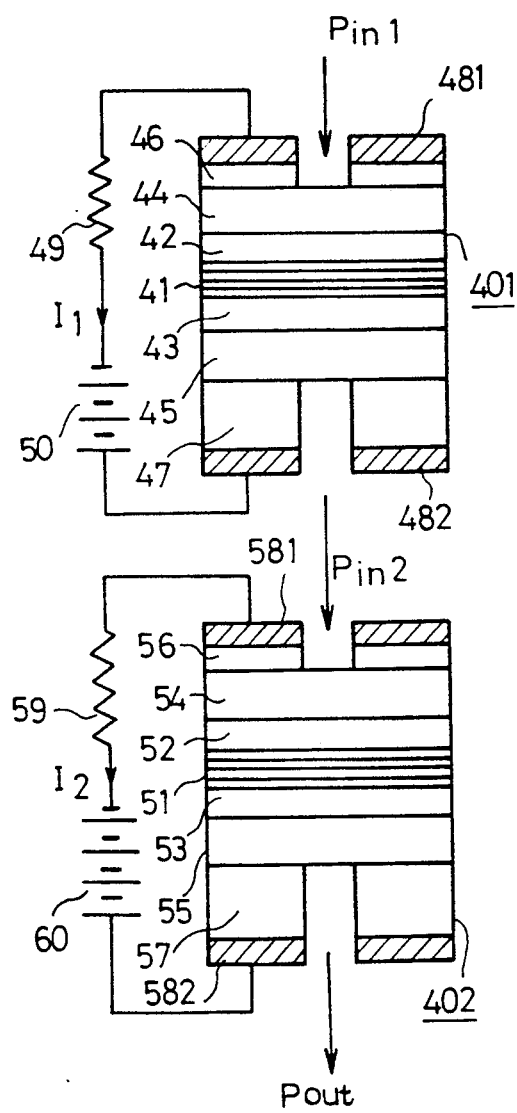
FIG. 4 shows an optical multi-stable device according to one embodiment of the present invention, in which p-i-n photodiodes are used.

In FIG. 4, an optical multi-stable device according to one embodiment of the present invention is shown. The device shown in FIG. 4 includes an input side photodiode 401 and an output side photodiode 402. The input side photodiode 401, on which light of intensity $P_{in1}$ is incident, comprises an AlGaAs/GaAs multiple quantum well layer 41, undoped AlGaAs layers 42 and 43 disposed on the opposed surfaces of the layer 41, a p-type AlGaAs layer 44 disposed on the undoped AlGaAs layer 42, an n-type AlGaAs layer 45 disposed on the other undoped AlGaAs layer 43, a p-type GaAs layer 46 disposed on the p-type AlGaAs layer 44 surrounding the portion of the layer 44 onto which light is incident, an n-type GaAs layer 47 disposed on the n-type AlGaAs layer 45 to surrounding the portion of the layer 45 from which light emerges, and electrodes 481 and 482 respectively disposed on the p-type and n-type GaAs layers 46 and 47. An external voltage source 50 is connected in series with a resistor 49 between the electrodes 481 and 482 with a polarity applying a reverse bias to the photodiode 401.

The input side photodiode 402 receives light of intensity $P_{in2}$, which is dependent on the absorption characteristic (or photocurrent characteristic) of the input side photodiode 401. The photodiode 402 comprises an AlGaAs/GaAs multiple quantum well layer 51, undoped AlGaAs layers 52 and 53 disposed on the opposed surfaces of the layer 51, a p-type AlGaAs layer 54 disposed on the undoped AlGaAs layer 52, an n-type AlGaAs layer 55 disposed on the other undoped AlGaAs layer 53, a p-type GaAs layer 56 disposed on the p-type AlGaAs layer 54 surrounding the portion of the layer 54 onto which light is incident, an n-type GaAs layer 57 disposed on the n-type AlGaAs layer 55 surrounding the portion of the layer 55 from which light emerges, and electrodes 581 and 582 respectively disposed on the p-type and n-type GaAs layers 56 and 57. An external voltage source 60 is connected in series with a resistor 59 between the electrodes 581 and 582 with a polarity, applying a reverse bias to the photodiode 402.

FIGS. 5(a)-(f) illustrate characteristics of an optical multi-stable device according to one embodiment of the present invention. In each of FIGS. 5(a)-(f), a wavelength is plotted on the abscissa and the photocurrent is plotted along the ordinate.

Figure 6:
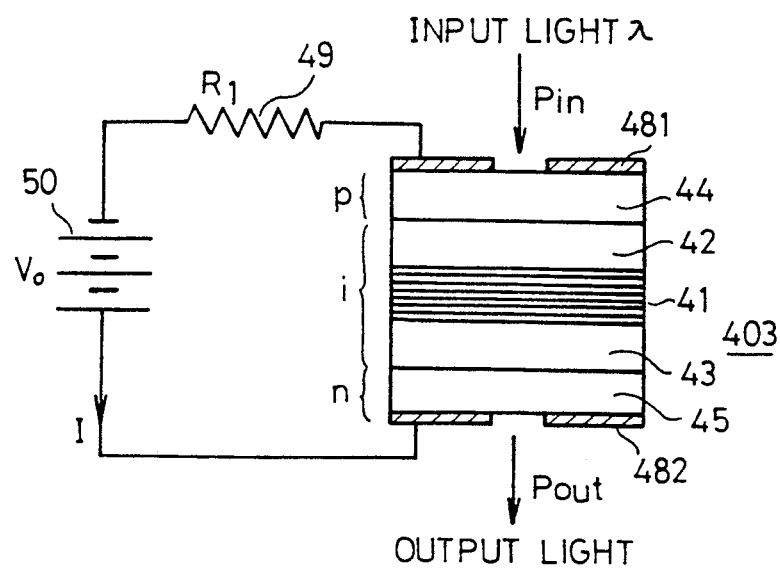
FIG. 6 shows a part of the optical multi-stable device of the present invention shown in FIG. 4.

Before describing the operation of the device shown in FIG. 4, the characteristic of a p-i-n element 403 having only one quantum well structure as shown in FIG. 6 is described. In FIG. 6, reference numerals and symbols similar to those used in FIG. 4 denote similar or equivalent items and functions.

Figure 7A:
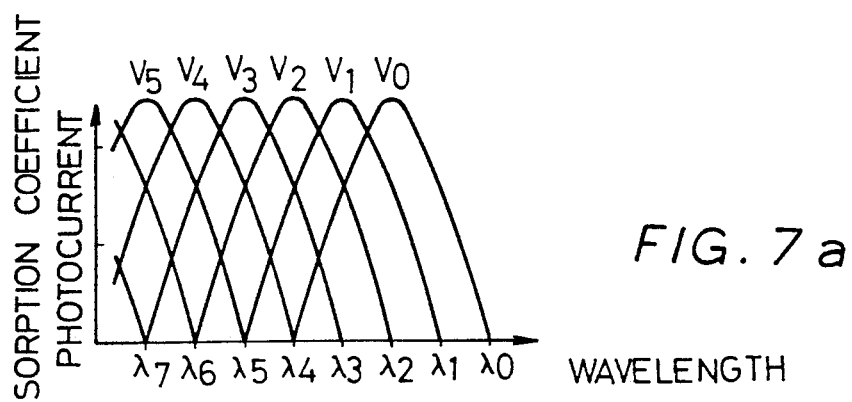
FIGS. 7(a)-7(d) show various characteristics for explaining the light absorption coefficient and light transmissivity of the device shown in FIG. 4.

As stated previously, the quantum well exhibits a peak in the absorption spectrum due to exciton absorption corresponding to a quantum level transition, and the absorption peak can be shifted by varying a voltage (hereinafter referred to as internal voltage $V_{in}$) applied to the optical bistable device 403 comprising the p-i-n photodiode. FIG. 7(a) shows photocurrent spectra or light absorption spectra resulting from varying the internal voltage $V_{in}$ applied to the quantum well layer 41 of the optical bistable element of FIG. 6. In FIG. 7(a), the value $V_0$ of the internal voltage $V_{in}$ is the sum of the externally applied reverse bias voltage V and the built-in voltage of the element.

Figure 7B:
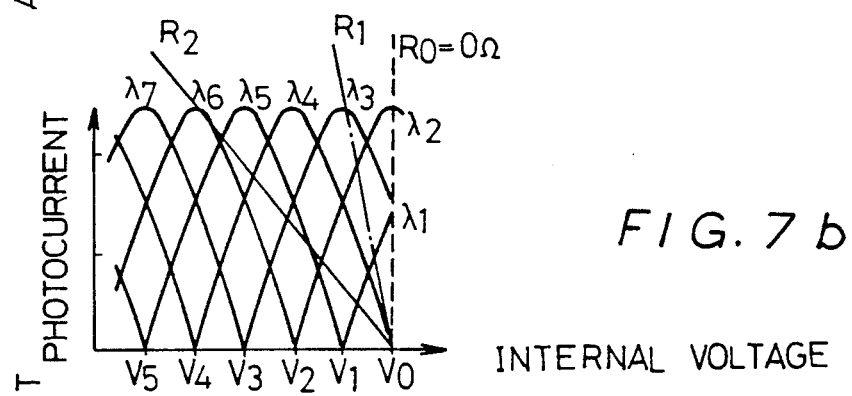

From FIG. 7(a), the relationship between the internal voltage $V_{in}$ and the photocurrent I for various wavelengths $\lambda_n$ can be re-written as shown in FIG. 7(b). The photocurrent I is a function of the wavelength $\lambda$, the input light intensity $P_{in}$, and the internal voltage $V_{in}$, and can be expressed as:

$$V_{in} = V_0 - I(V_{in}, P_{in}, \lambda)R \quad (3)$$

The photocurrent or absorption spectrum of a system including an external resistor 49 can be derived from the intersections of the line expressed by the equation (3) with the curves shown in FIG. 7(b). This is illustrated in FIG. 7(c).

When the value of the external resistor 49 is zero, i.e. $R = R_0 = 0$, a spectrum similar to the photocurrent spectrum for $V_{in} = V_0 (=0)$ shown in FIG. 7(a) is exhibited. When the external resistor 49 has a value $R_1$, a voltage drop is produced across the resistor 49 due to the generation of photocurrent, so that the internal voltage $V_{in}$ decreases. Then, the wavelength at which an absorption peak occurs shifts toward the shorter wavelength side, as is understood from FIG. 7(a), and the shape of the absorption spectrum changes as indicated by a curve $R_1$ shown in FIG. 7(c). When the value of the resistor 49 increases further, a hysteresis characteristic is developed. The wavelength at which hysteresis appears in the absorption spectrum can be changed by changing electrical parameters, such as the value of the external resistor and the voltage.

Figure 7C:
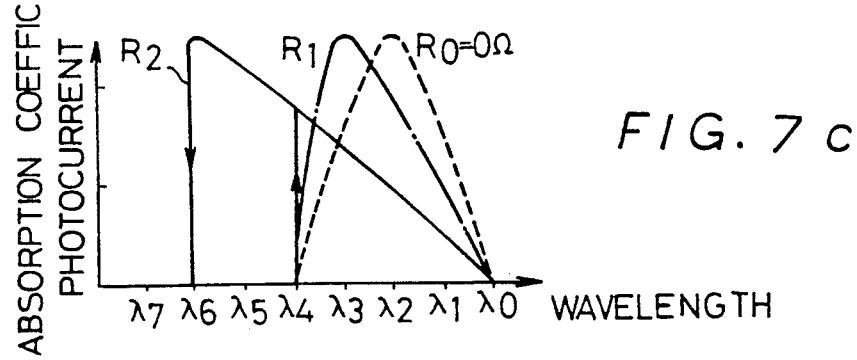
Figure 7D:
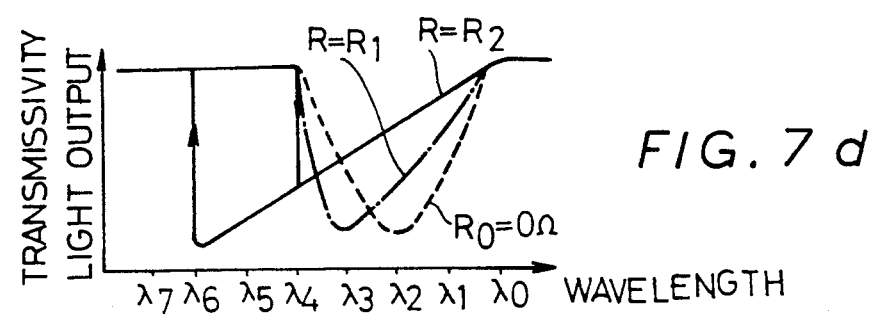
Figure 8:
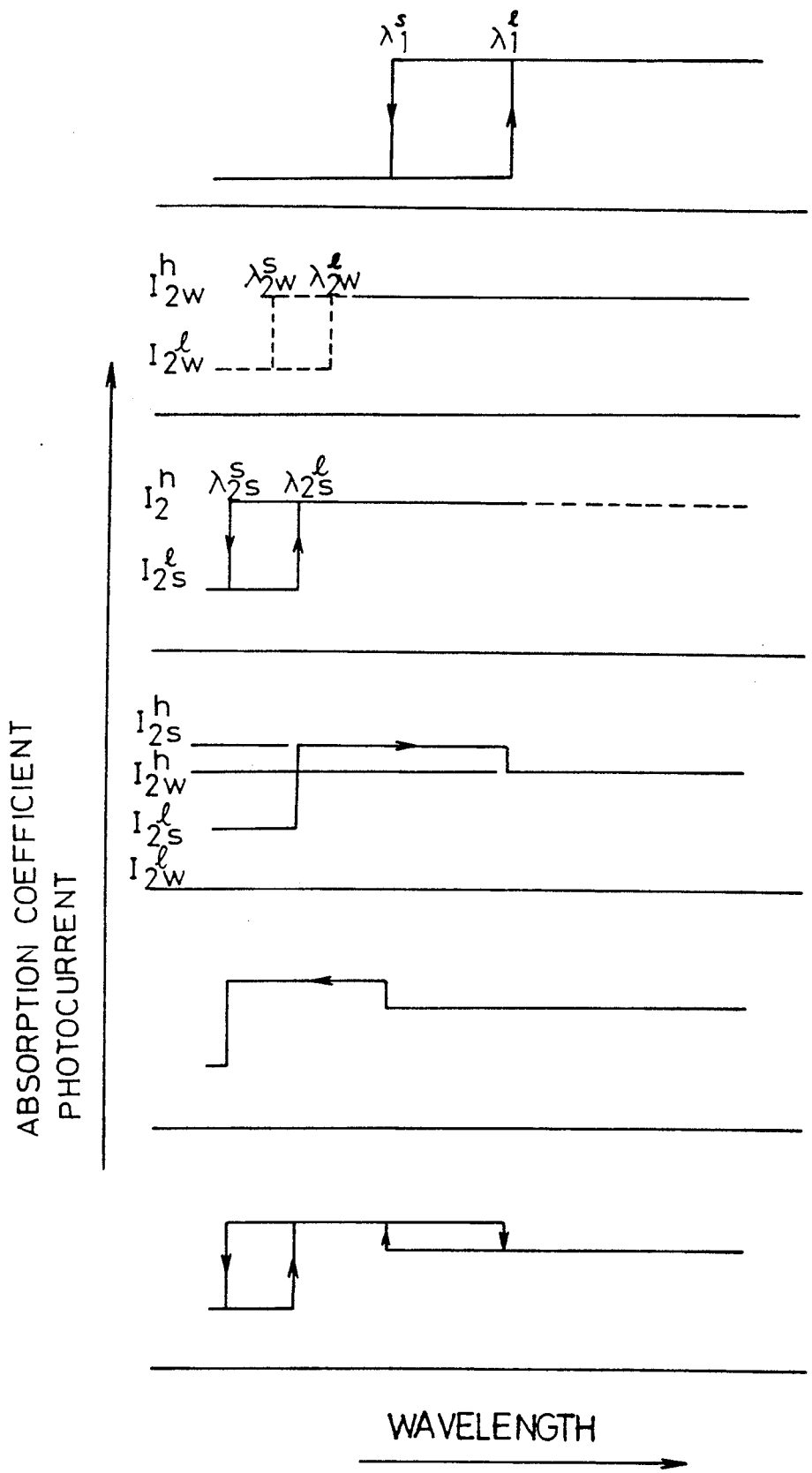
FIGS. 8-33 show sets of various characteristics for explaining the light absorption coefficient and light transmissivity of the device shown in FIG. 4.
Figure 9:
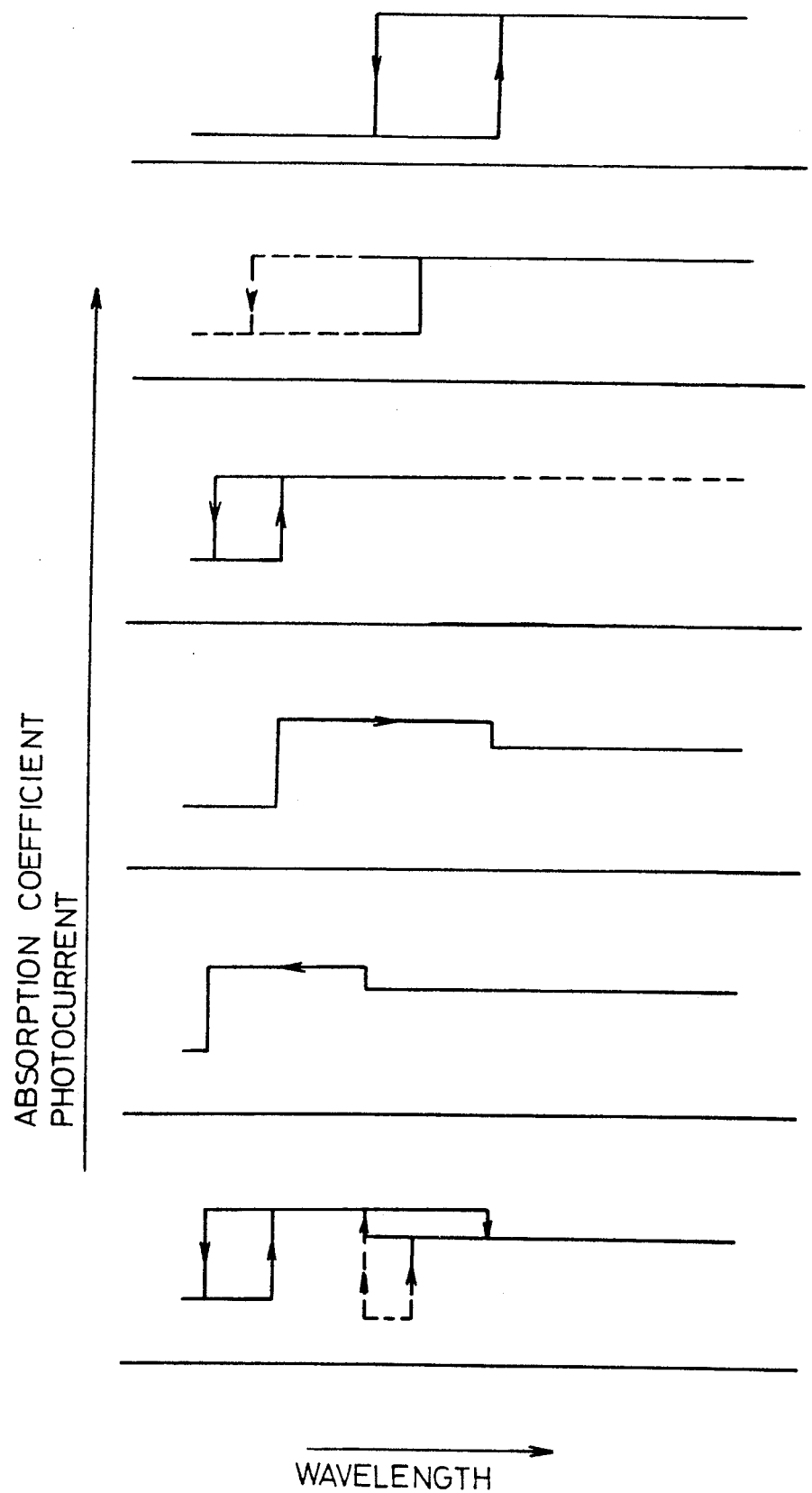
Figure 10:
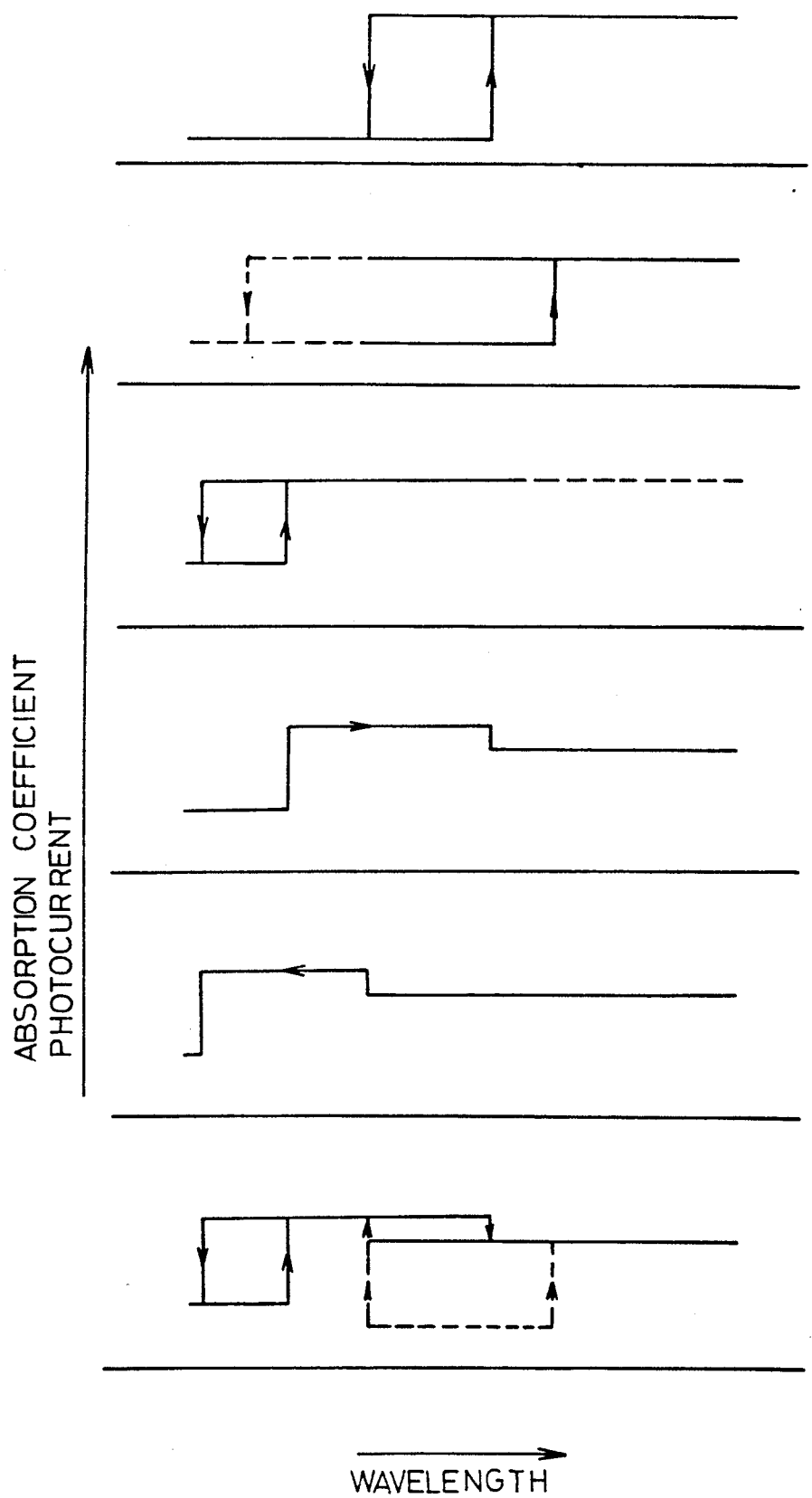
Figure 11:
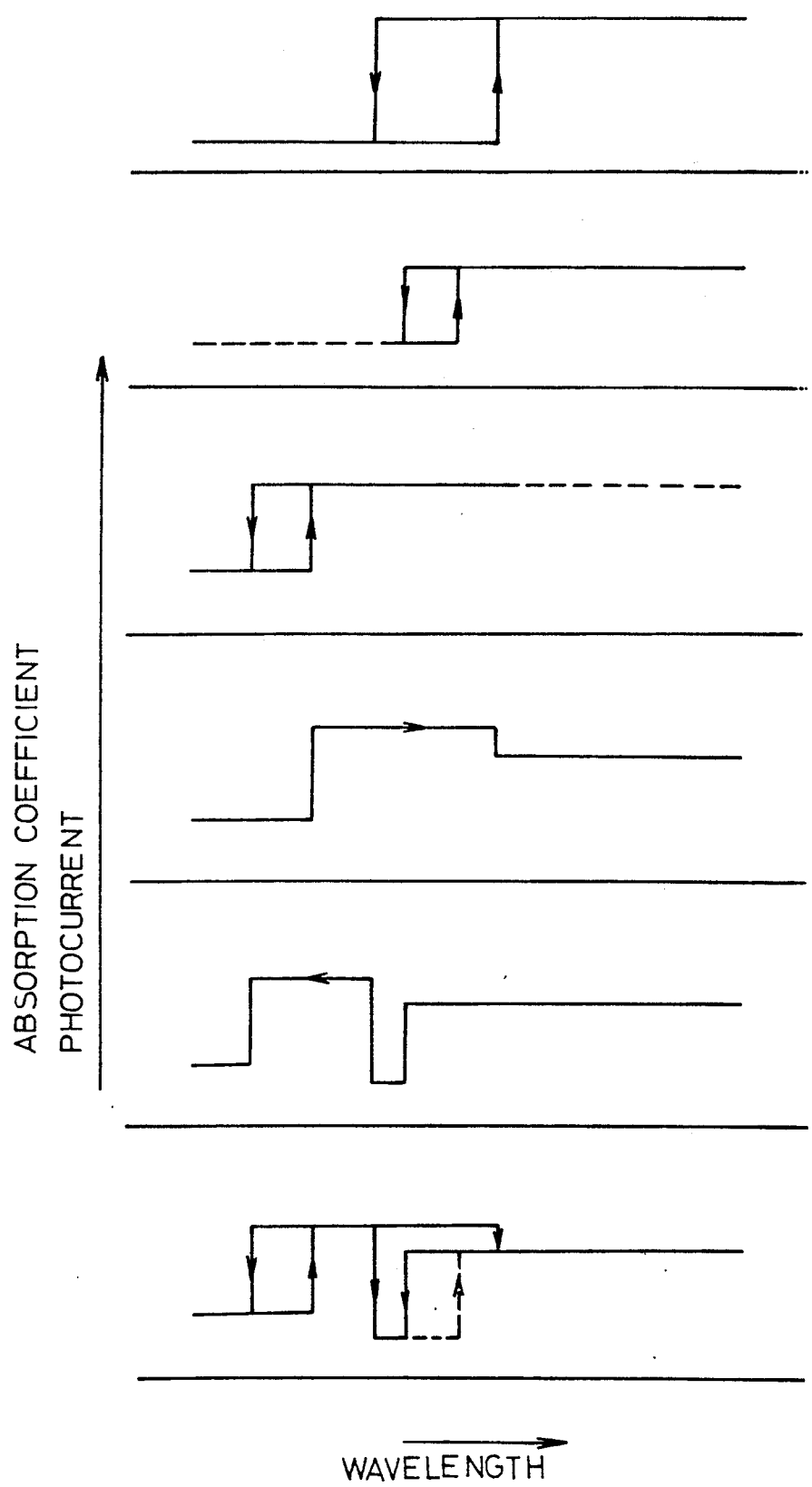
Figure 12:
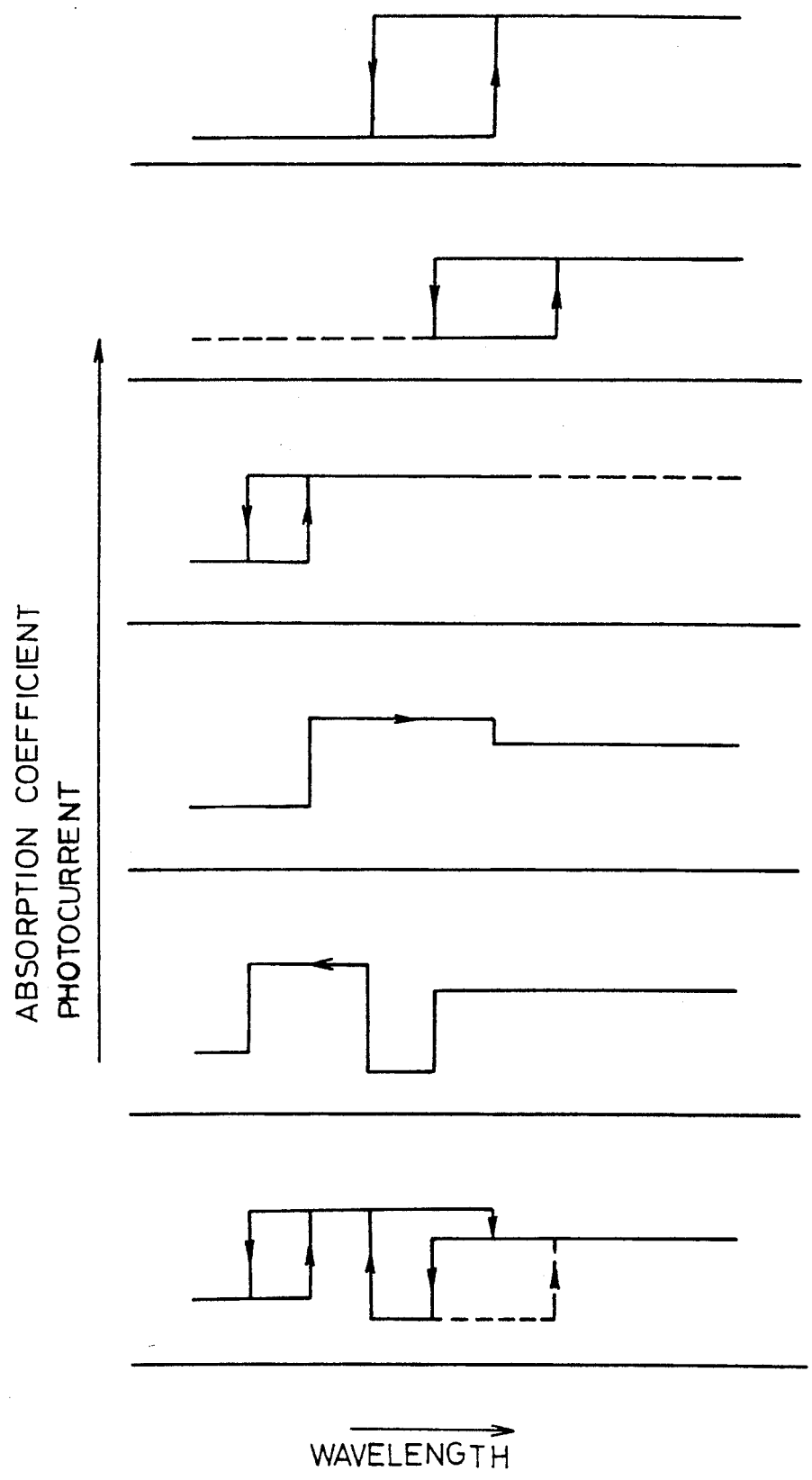
Figure 13:
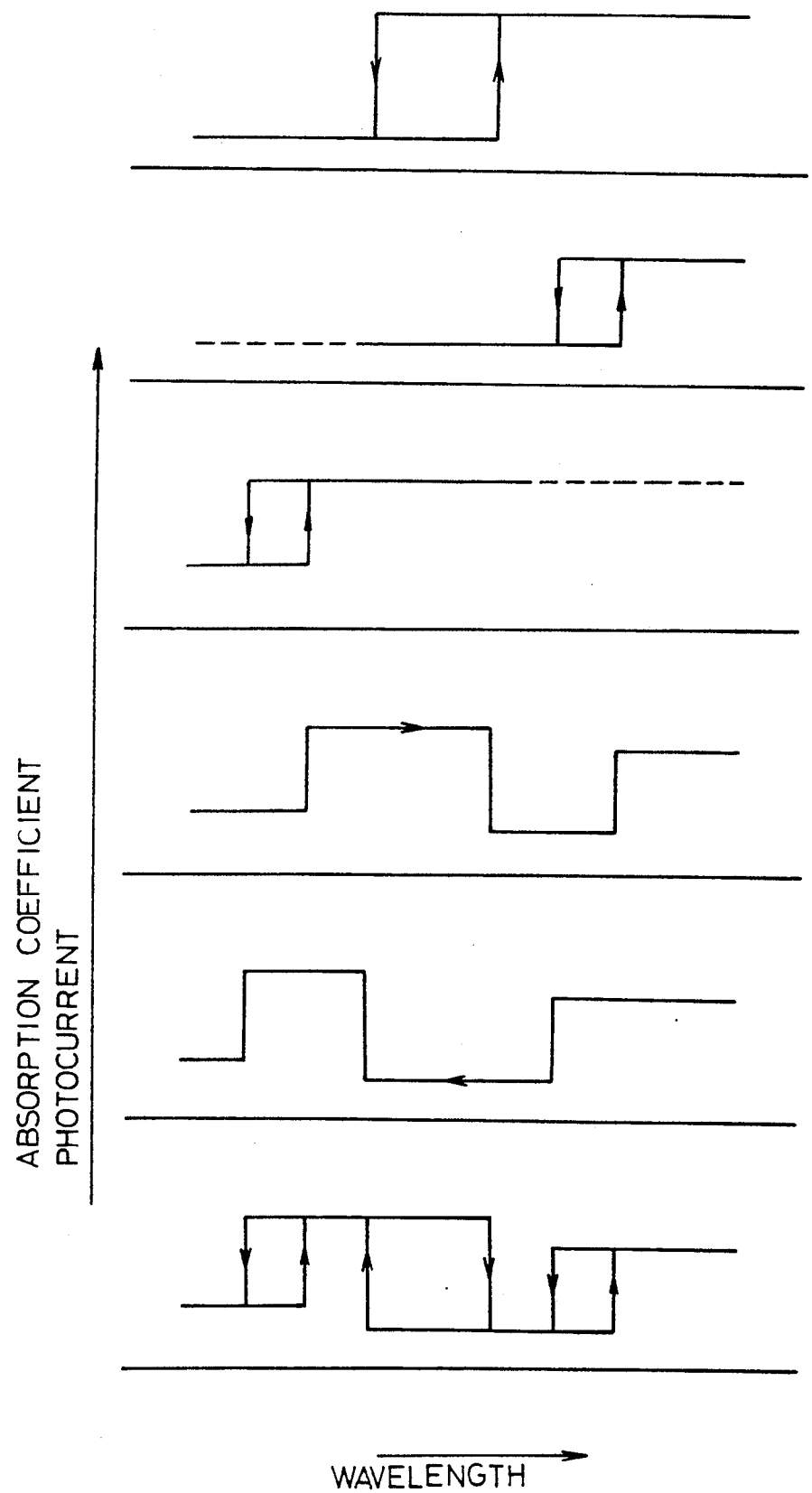
Figure 14:
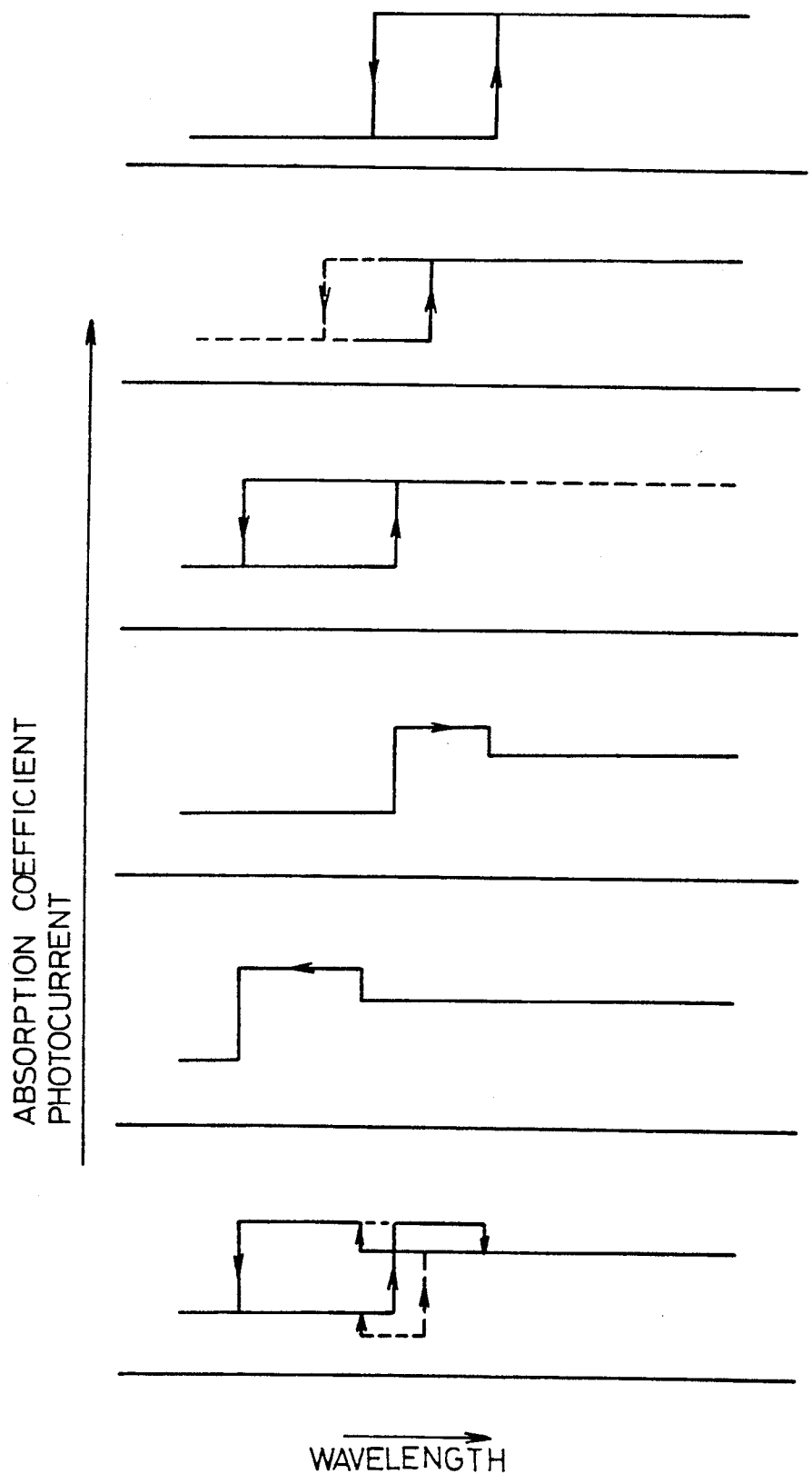
Figure 15:
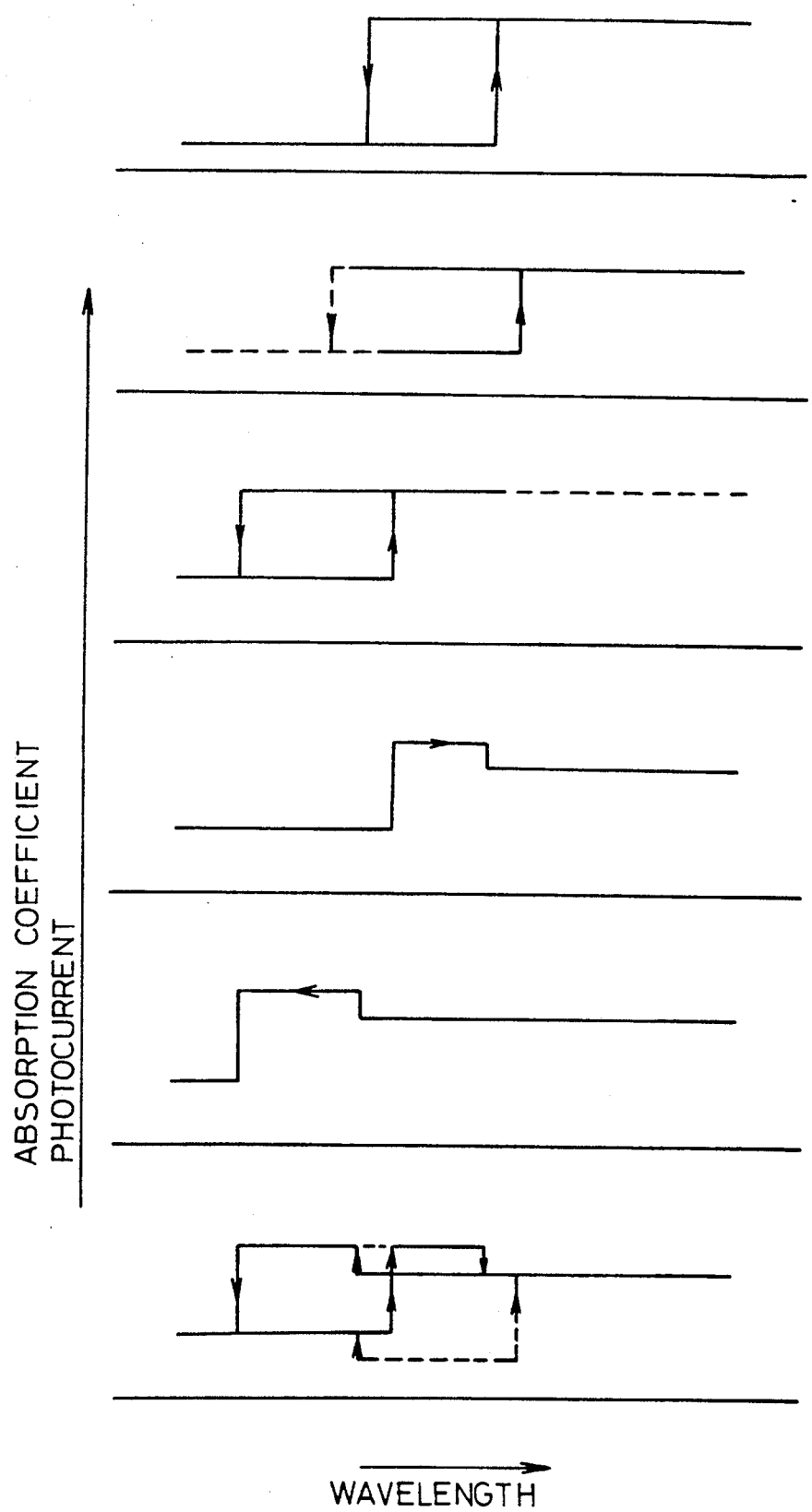
Figure 16:
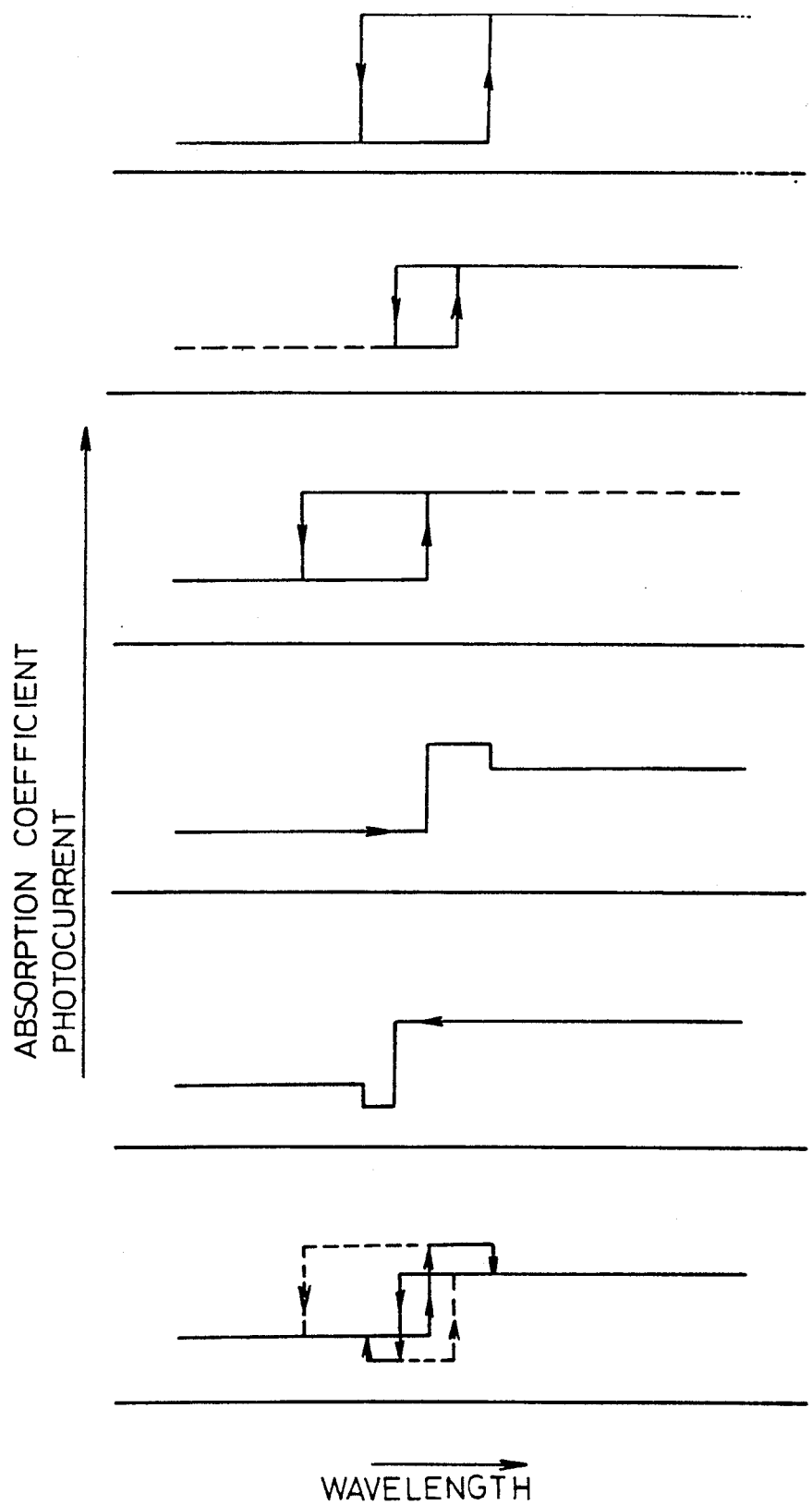
Figure 17:
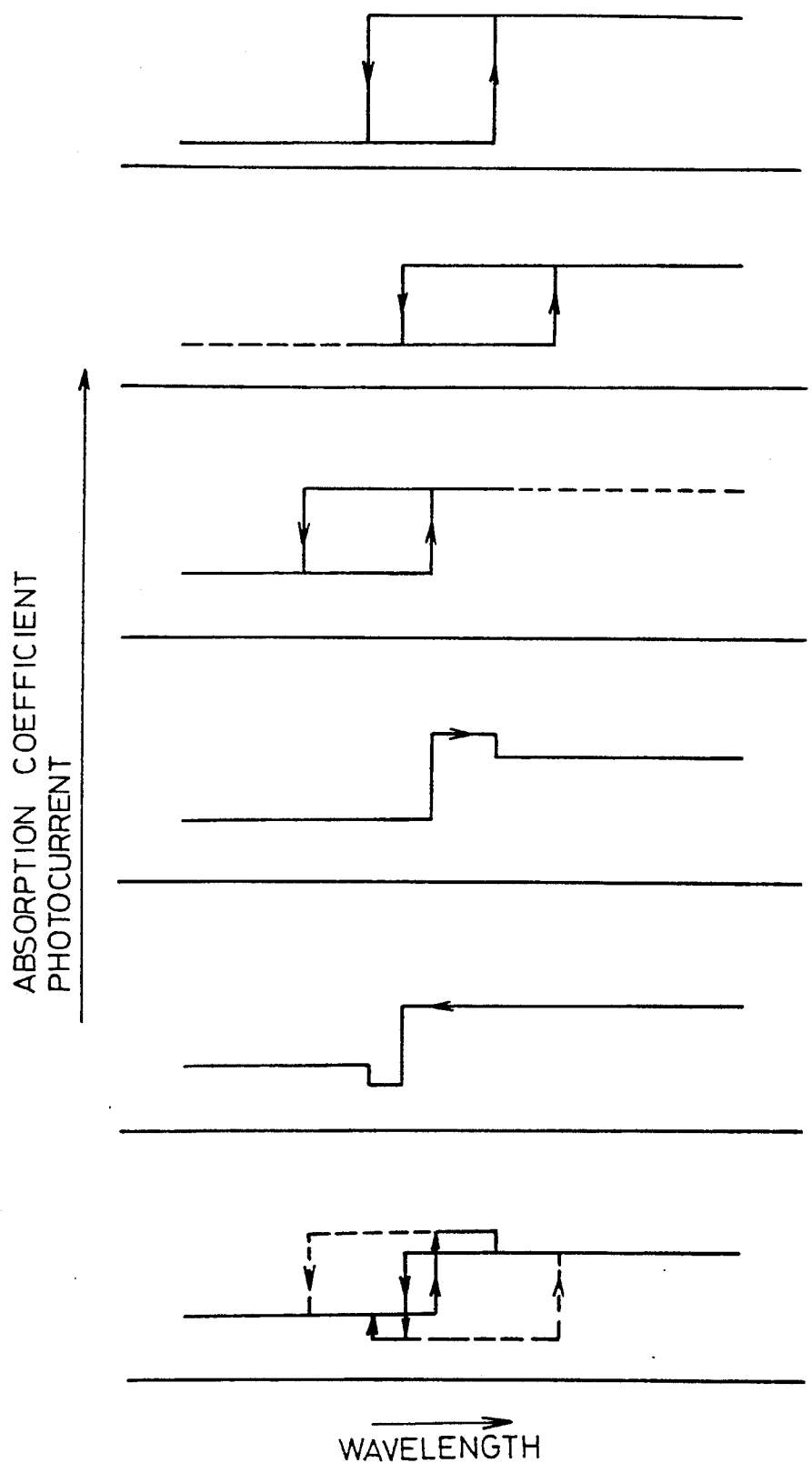
Figure 18:
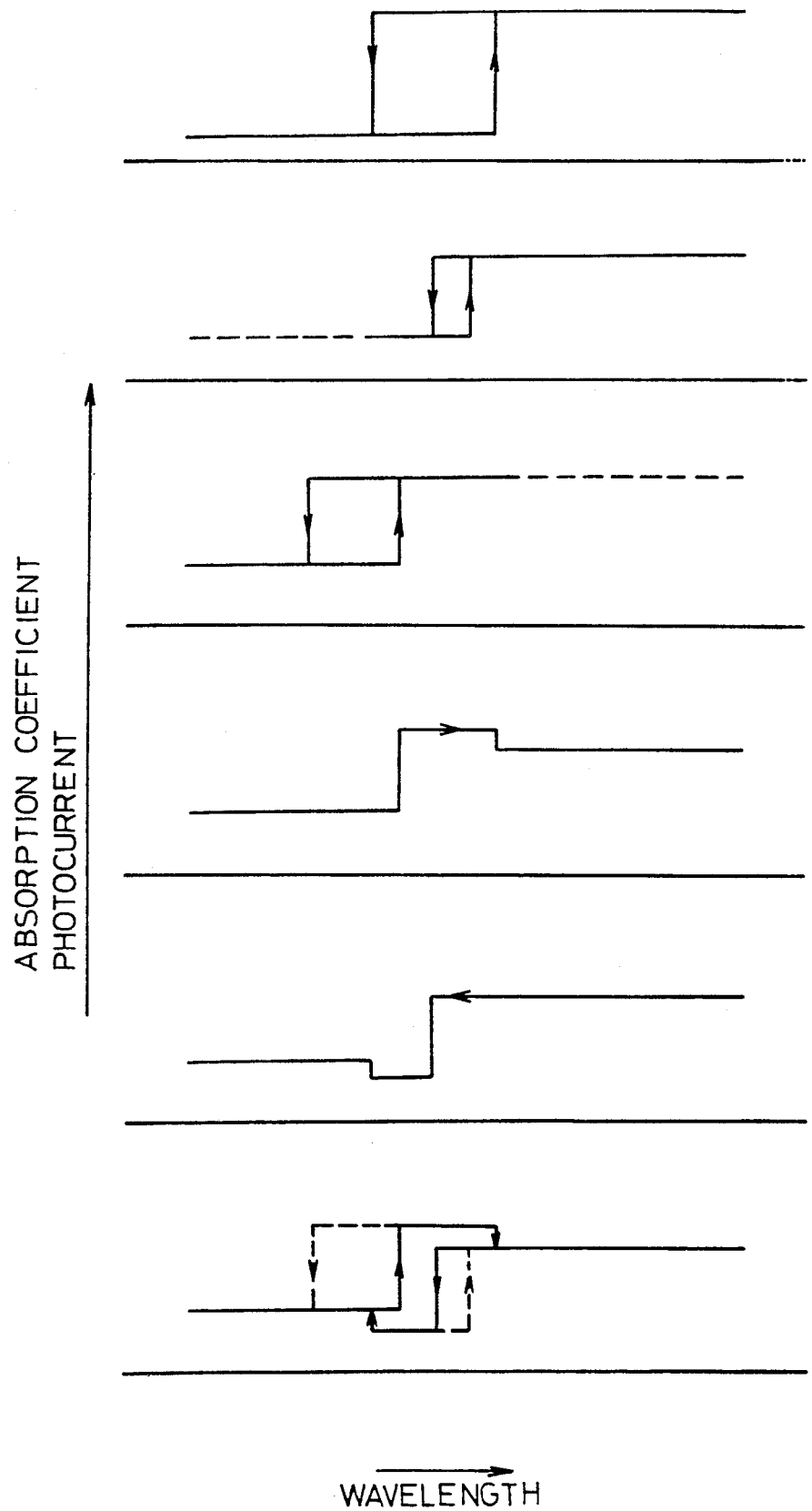
Figure 19:
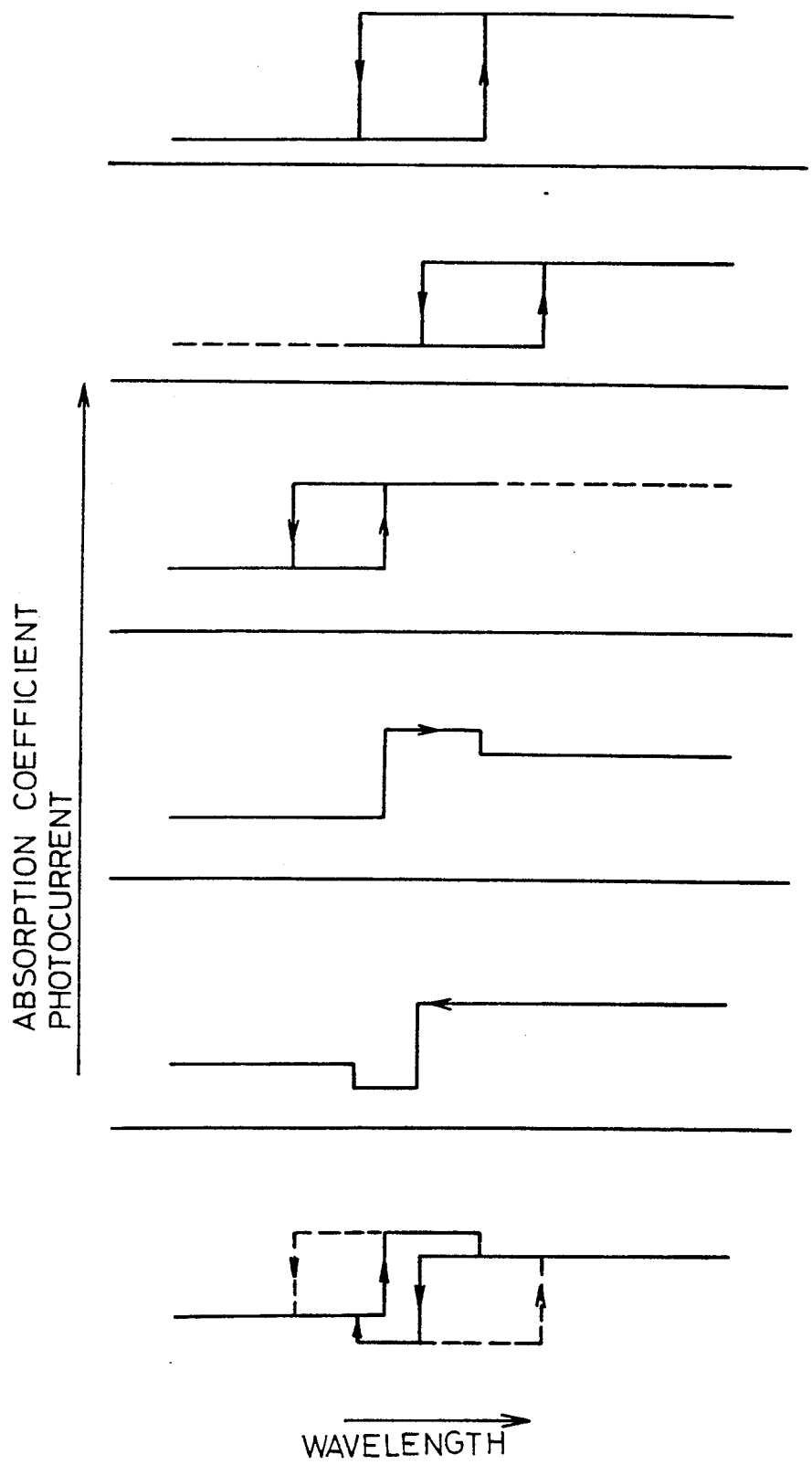
Figure 20:
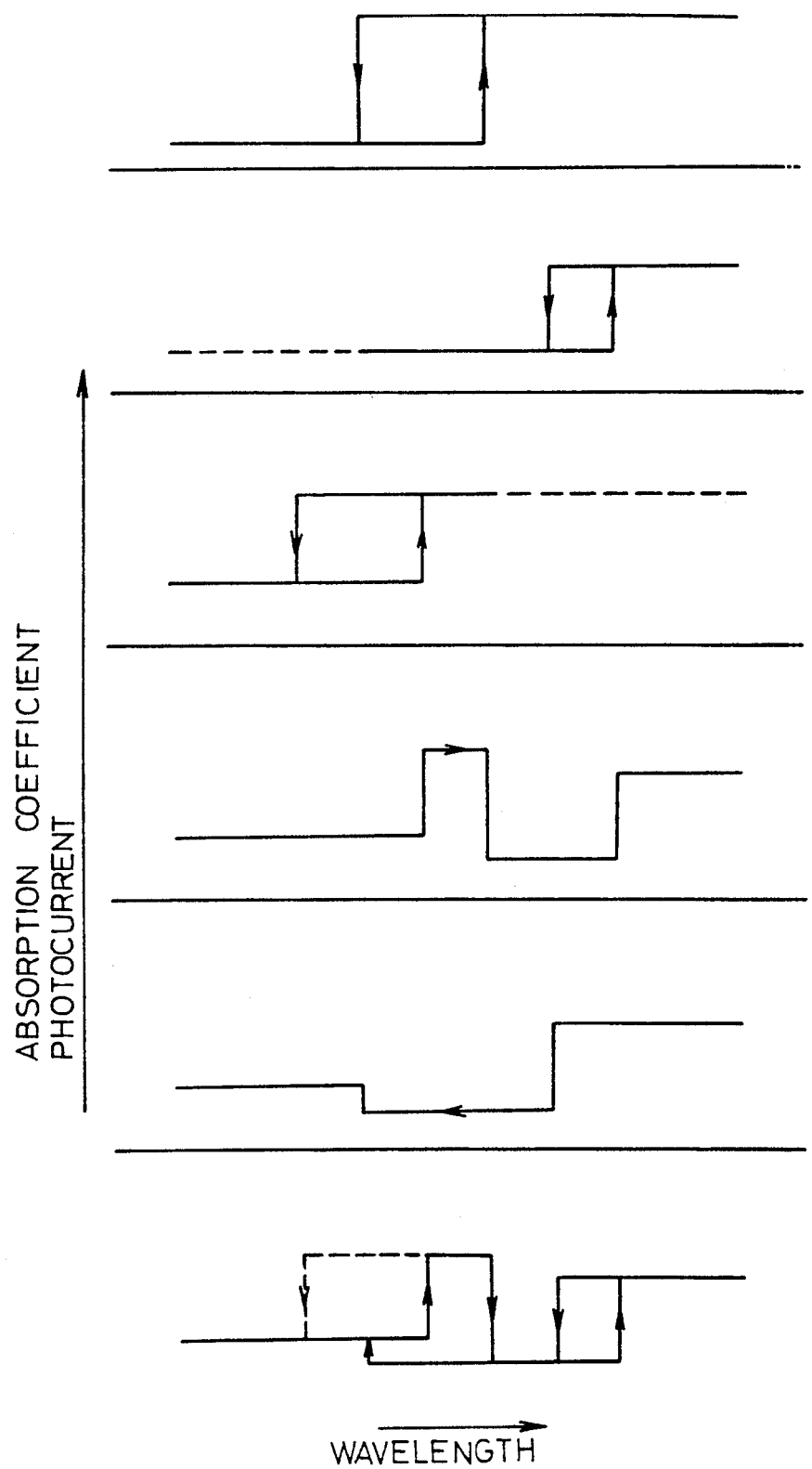
Figure 21:
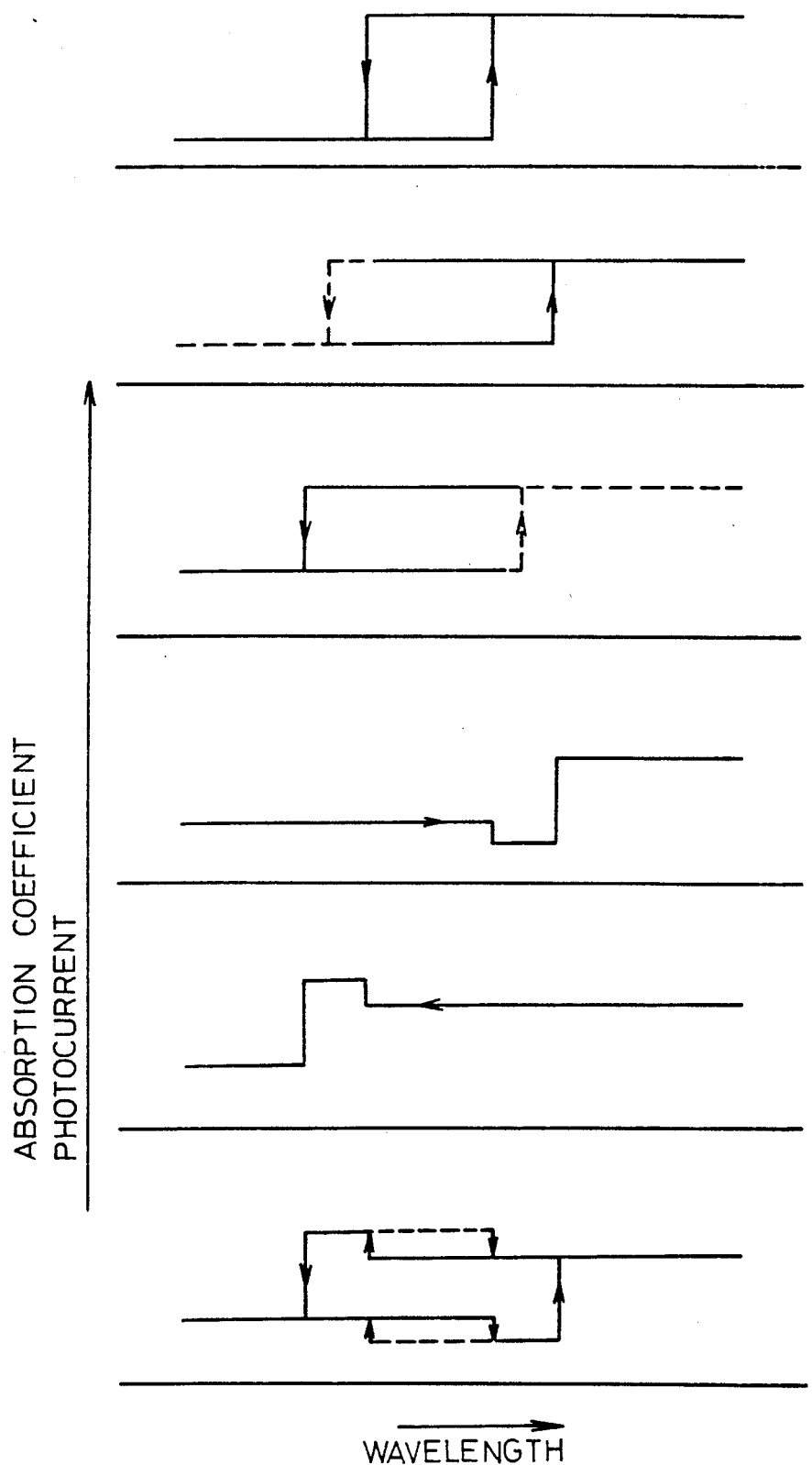
Figure 22:
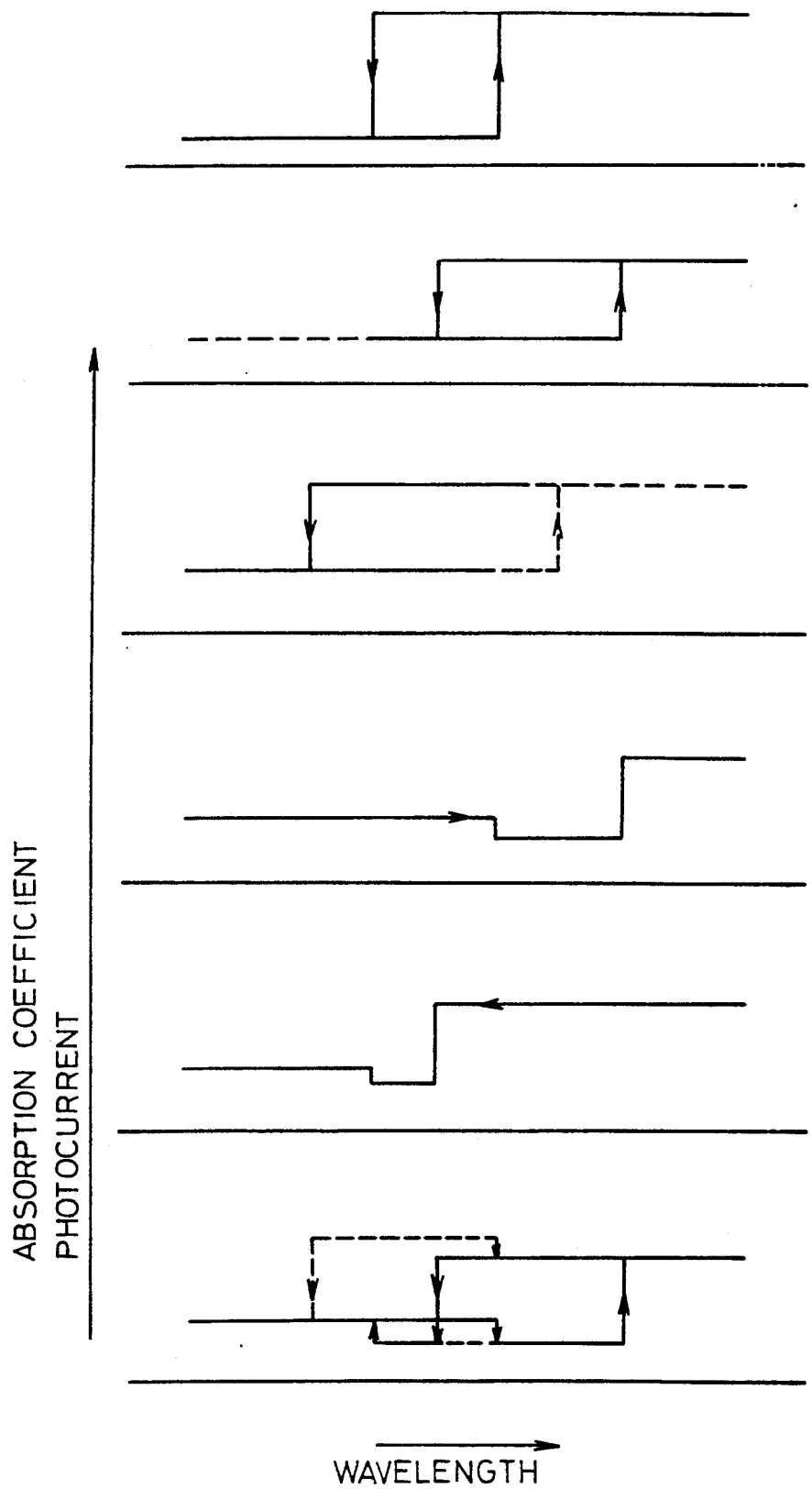
Figure 23:
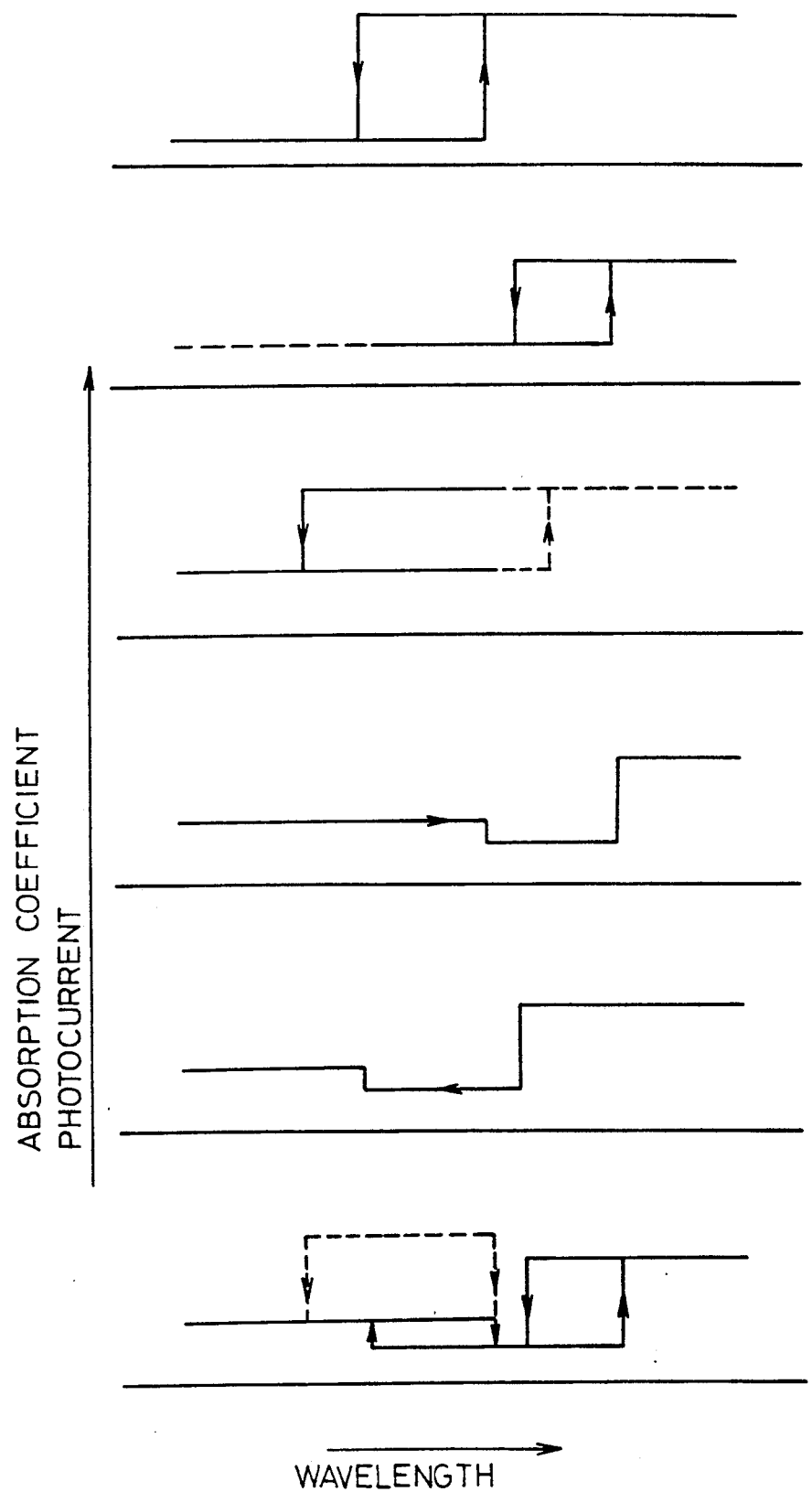
Figure 24:
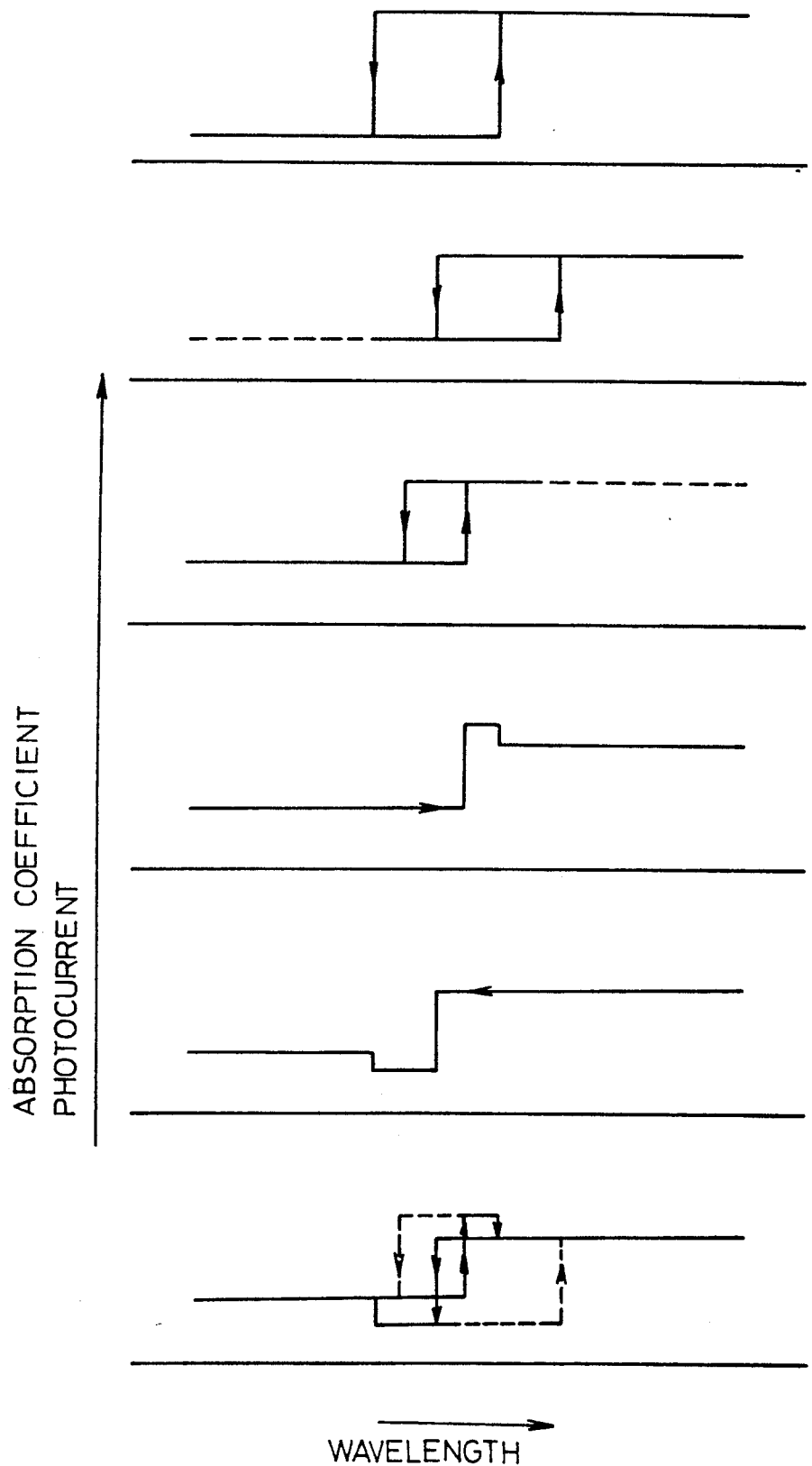
Figure 25:
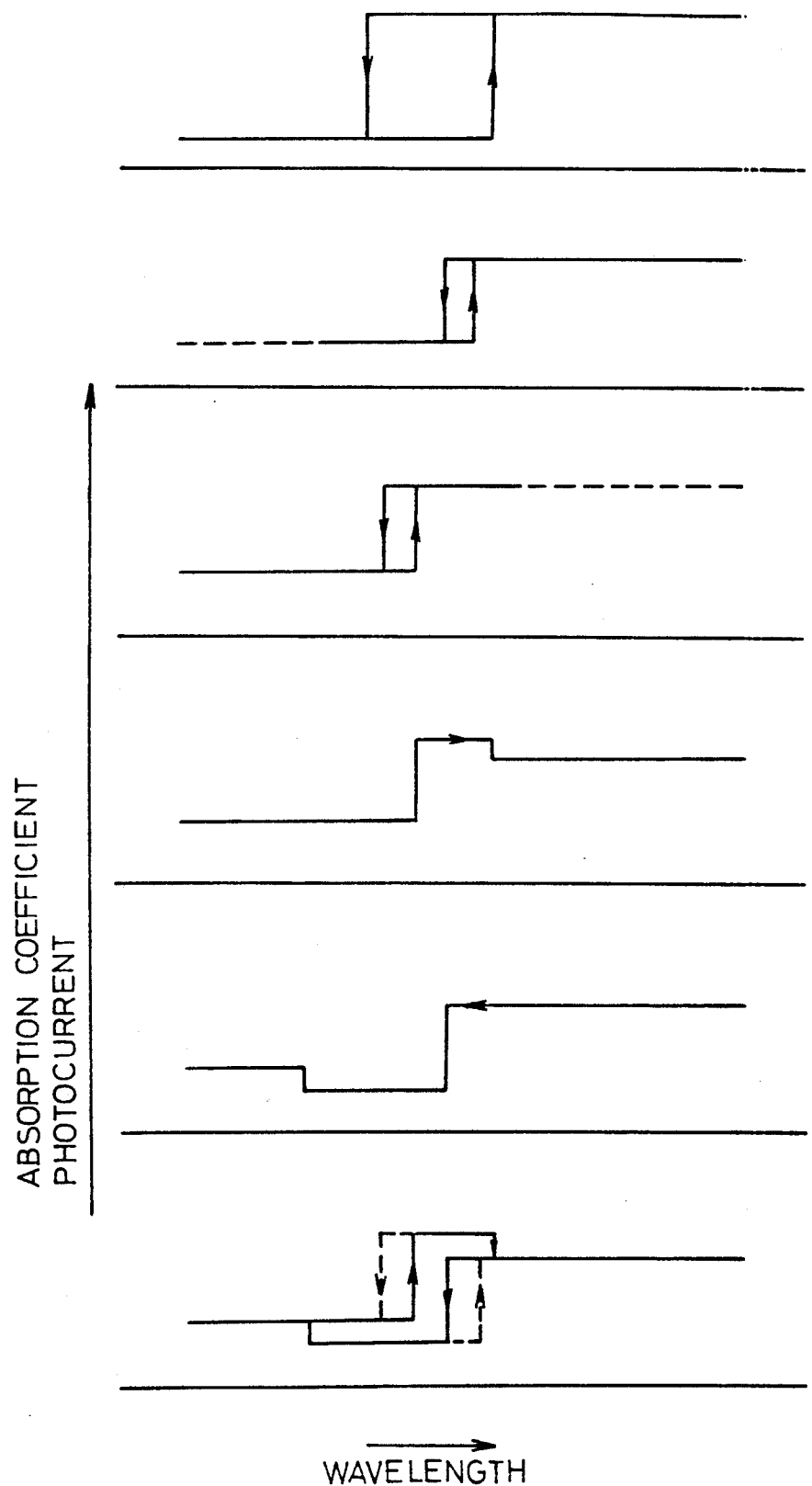
Figure 26:
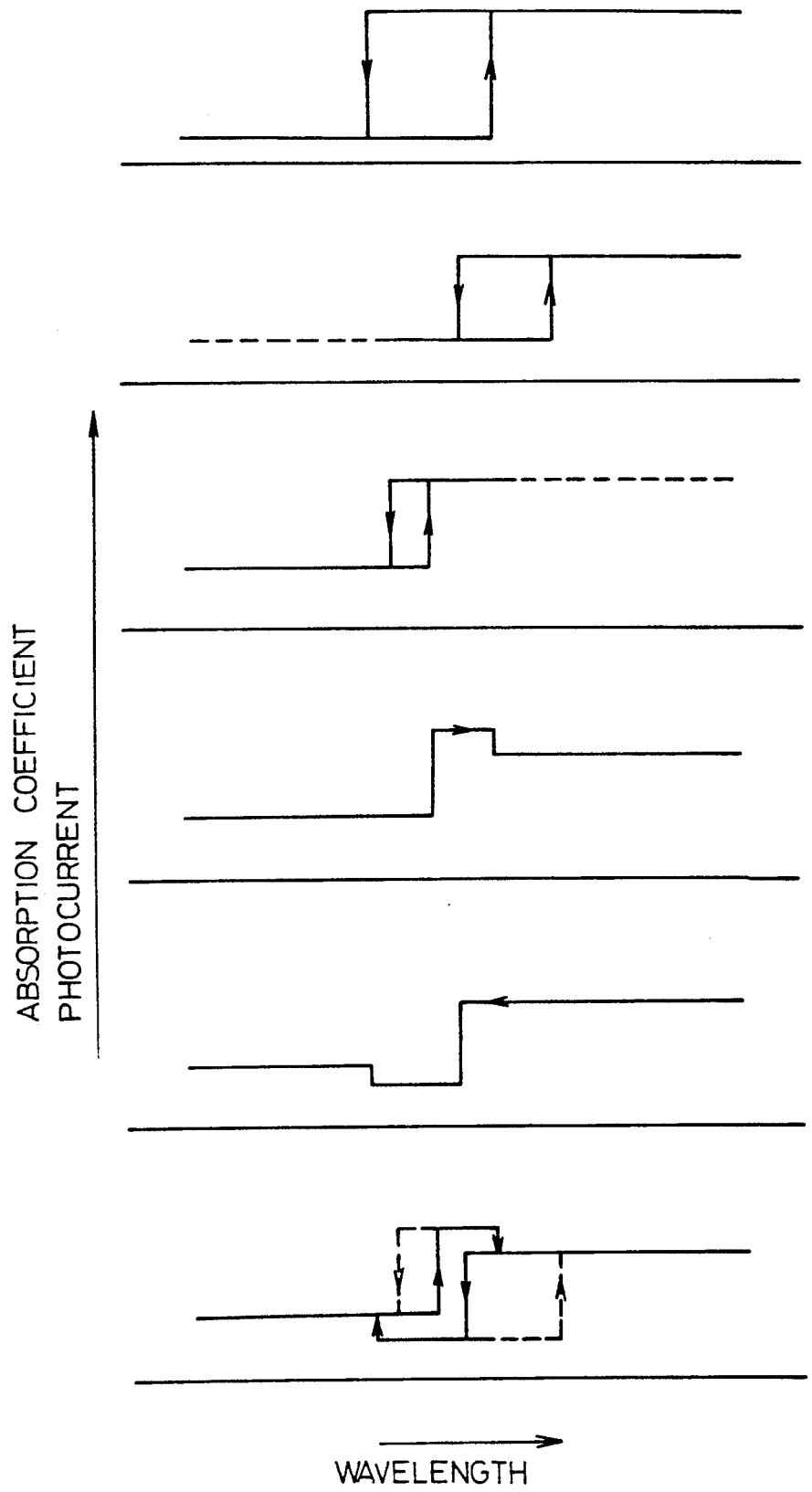
Figure 27:
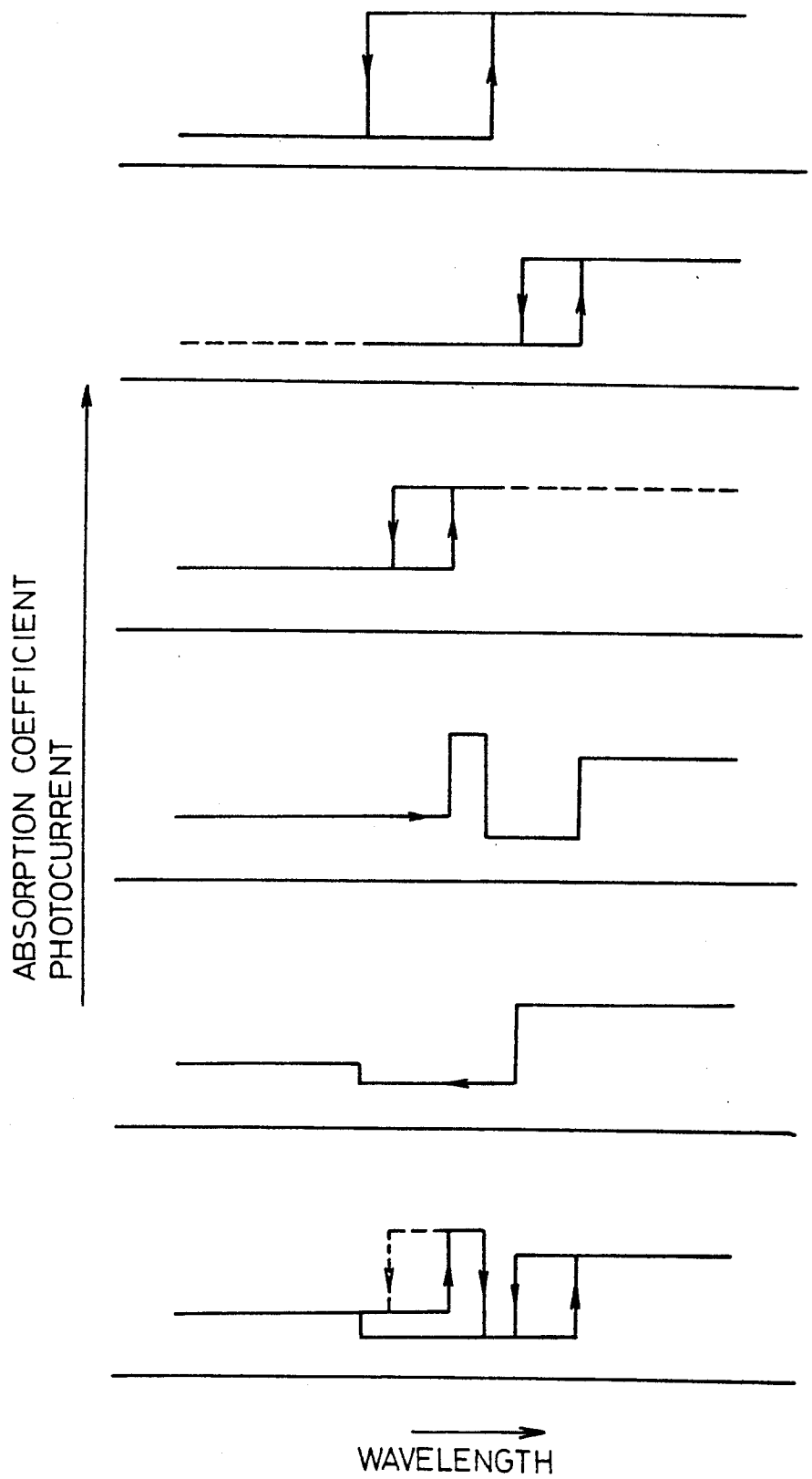
Figure 28:
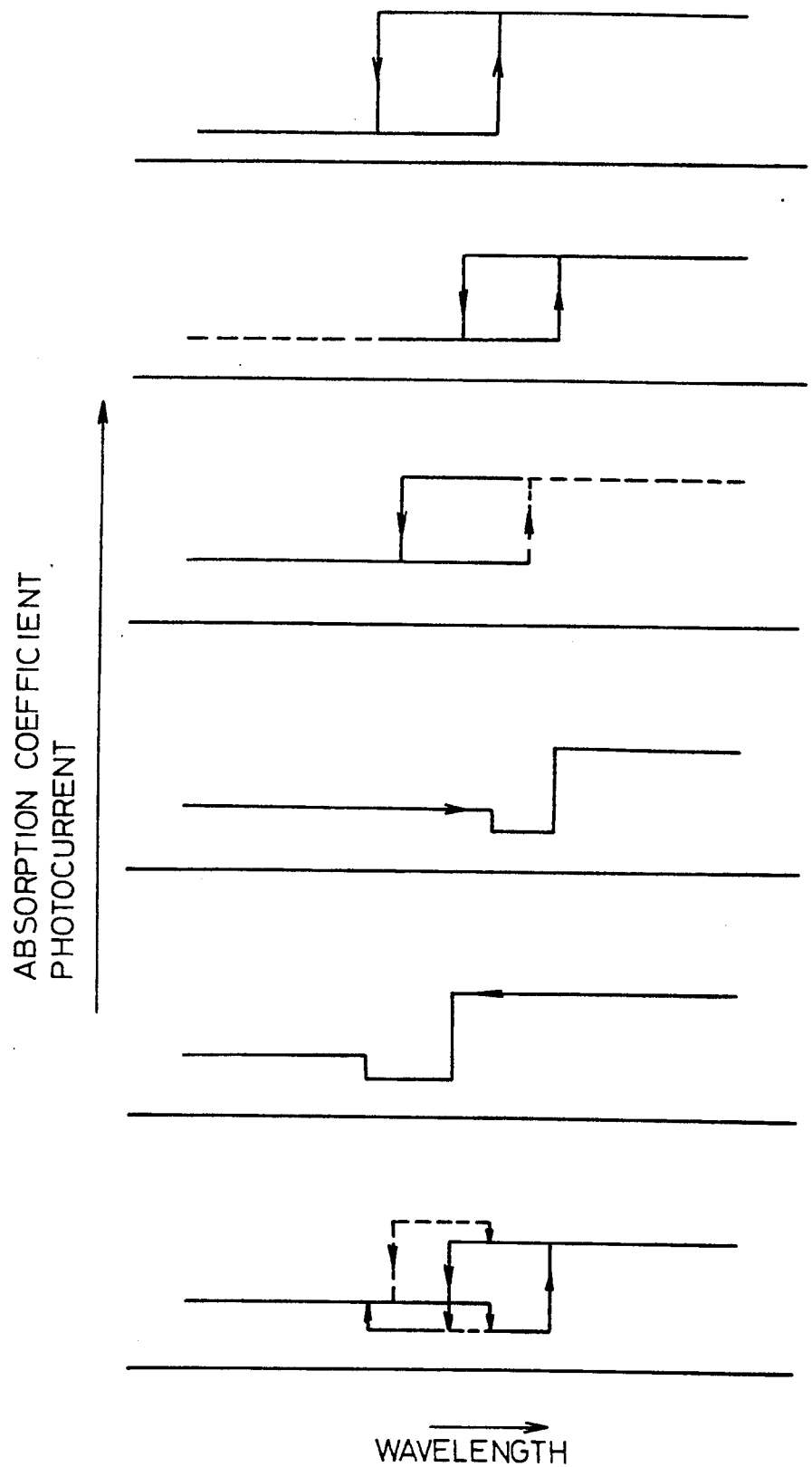
Figure 29:
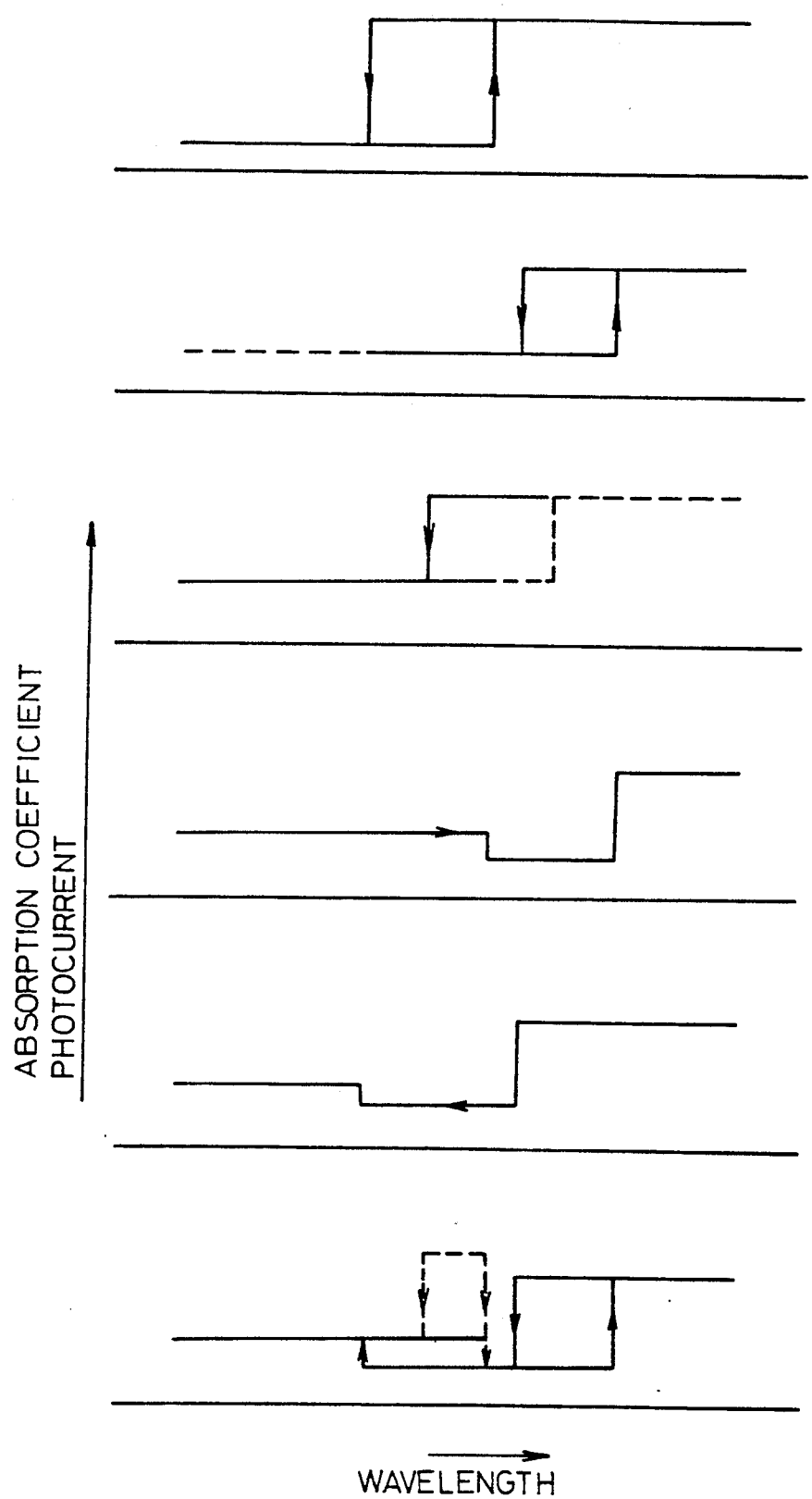
Figure 30:
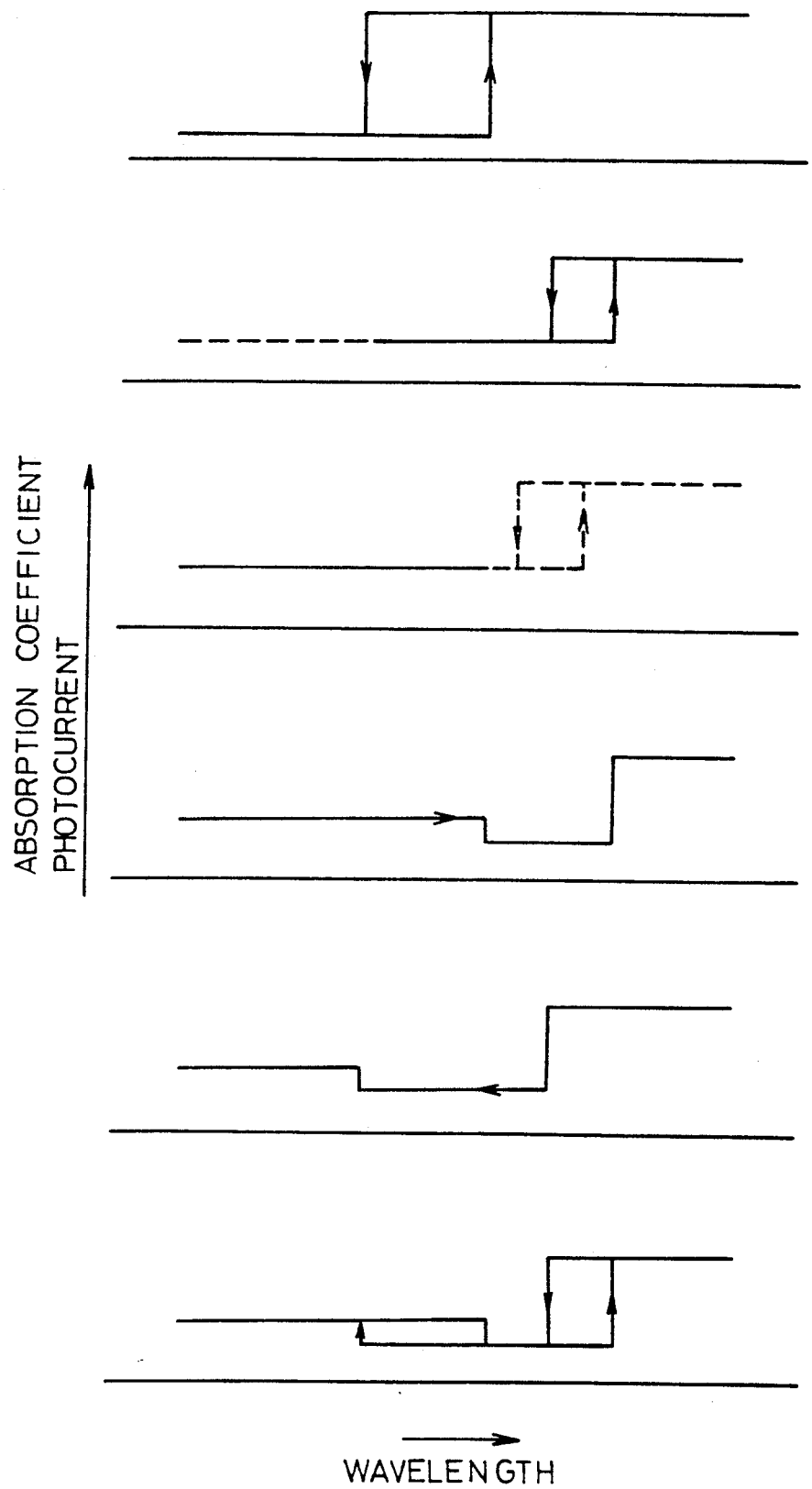

From FIG. 7(c), the output light intensity $P_{out}$ or transmissivity can be derived, which is shown in FIG. 7(d).

Now, the operation of the optical multi-stable device shown in FIG. 4 is described.

Figure 5A:
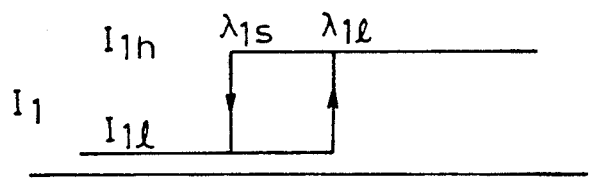
FIGS. 5(a)-5(f) show photocurrent versus wavelength characteristics of the optical multi-stable device of FIG. 4.

FIG. 5(a) shows, in an enlarged fashion, a hysteresis portion of the wavelength spectrum of the photocurrent $I_1$ which flows through the light input side diode 401. It may be considered that the photocurrent $I_1$ has a wavelength spectrum characteristic in which the value of $I_1$ changes at wavelengths $\lambda_{1s}$ and $\lambda_{1h}$ to one of two values $I_{1h}$ and $I_{1l}$ from the other of those values. The photocurrent of the succeeding stage output side photodiode 402 has a similar wavelength spectrum in which the value of the photocurrent switches at some wavelengths, but the spectrum varies depending on the intensity $P_{in2}$ of light incident on the photodiode 402. The intensity $P_{in2}$ is dependent on the absorption characteristic (i.e. photocurrent characteristic) of the input side photodiode 401. For the photocurrent spectrum shown in FIG. 5(a), $P_{in2}$ is smaller than $I_{1h}$ and is larger than $I_{1l}$. That is, the intensity of light incident on the succeeding stage diode 402 has two values.

Figure 5B:
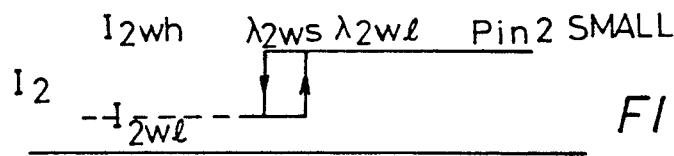
Figure 5C:
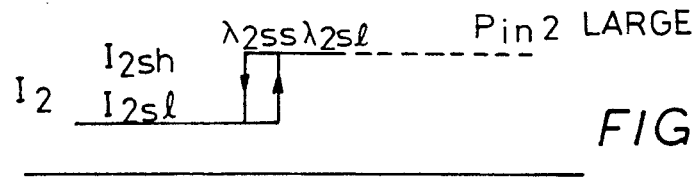
Figure 5D:
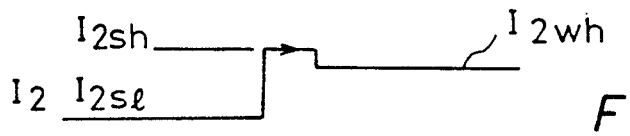
Figure 5E:
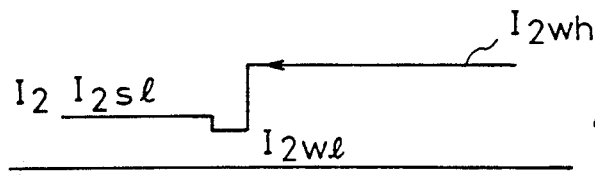

Then, the diode 402 may exhibit two photocurrent spectra for smaller and larger $P_{in2}$, as shown in FIGS. 5(b) and 5(c). When the intensity $P_{in2}$ of light incident on the photodiode 402 is large, a larger photocurrent will flow, which causes a voltage drop across the external resistor to increase, so that the spectral location where the hysteresis occurs is shifted toward the shorter wavelength side and the photocurrent levels increase. That is, in FIGS. 5(b) and 5(c) $\lambda_{2ws} > \lambda_{2ss}$, $\lambda_{2wl} > \lambda_{2sl}$, $I_{2wh} < I_{2sh}$, and $I_{2wl} < I_{2sl}$. In FIGS. 5(b) and 5(c), regions indicated by broken lines are actually not present. Specifically, in the region where the wavelength is shorter than $\lambda_{1s}$, no state in which $P_{in2}$ is small exists, and the region where the wavelength is longer than $\lambda_{1l}$, no state in which $P_{in2}$ is large exists. Thus, the wavelength spectrum of $I_2$ which is the current flowing through the output side diode 402 exhibits a complex behavior as shown in FIG. 5(f) which comprises the characteristics shown in FIGS. 5(b) and 5(c) superimposed on each other, and which contains four stable points.

Figure 5F:
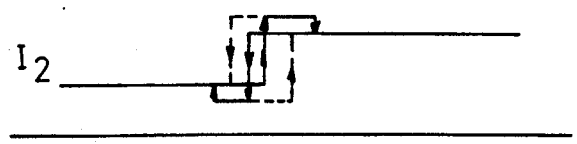

In FIG. 5(f), broken lines indicate portions which do not appear when the wavelength is scanned in an ordinary manner. That is, when the wavelength is scanned from shorter to longer wavelength sides, the characteristic shown in FIG. 5(d) results, whereas, when the wavelengths are scanned in the reverse direction, the characteristic shown in FIG. 5(e) results. The regions indicated by the broken lines will occur when the direction of scanning is changed.

Figure 31:
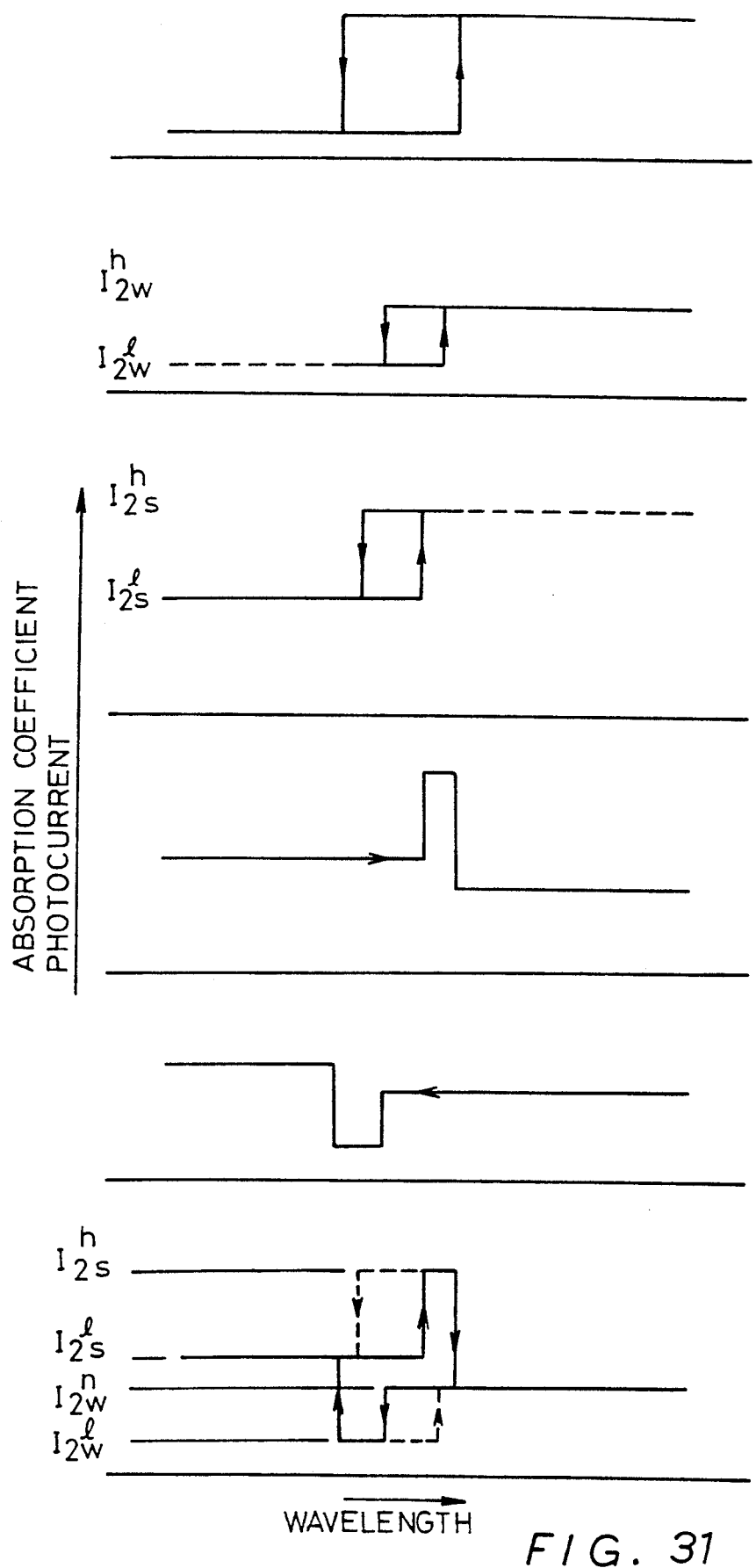
Figure 32:
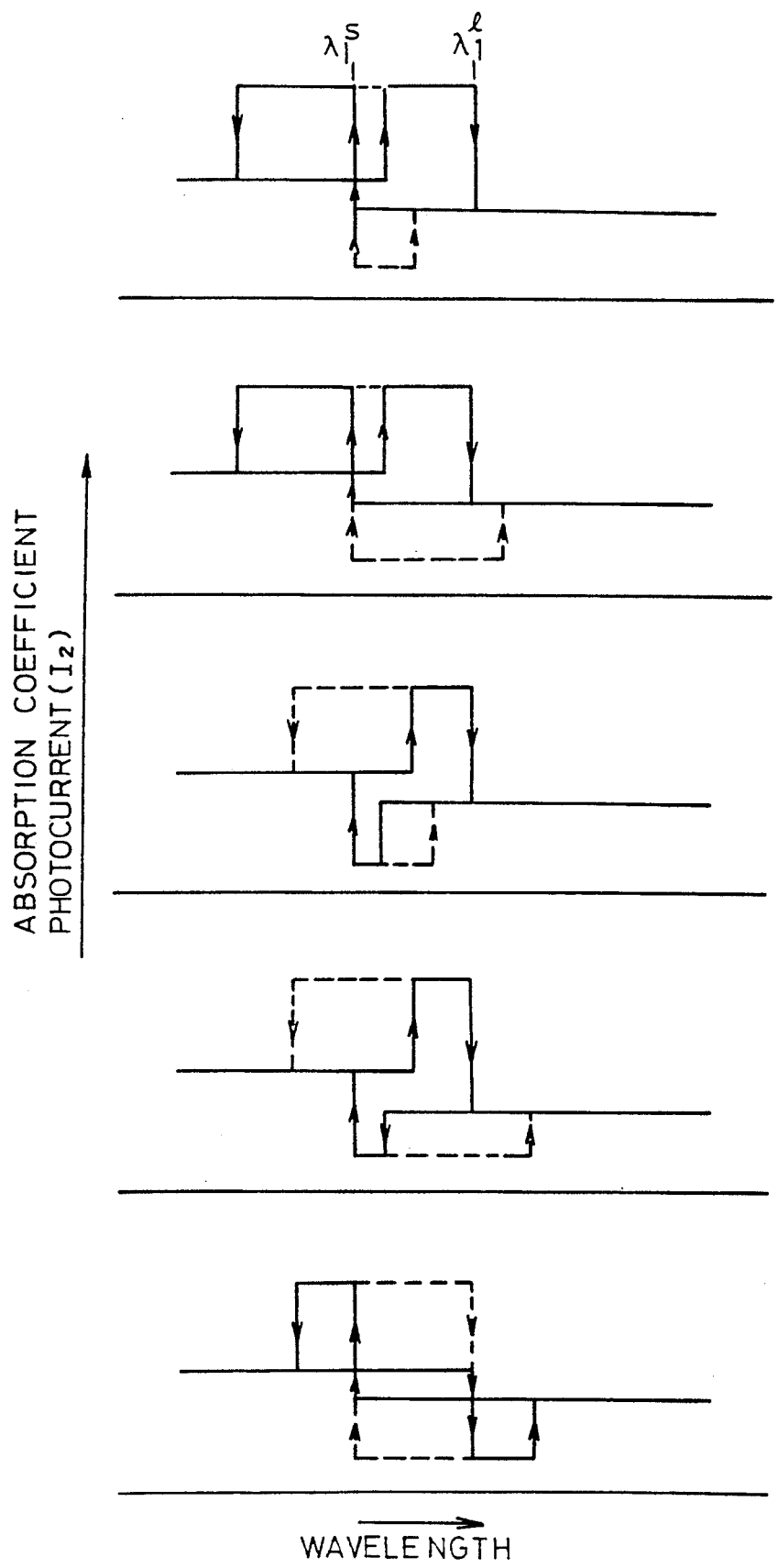
Figure 33:
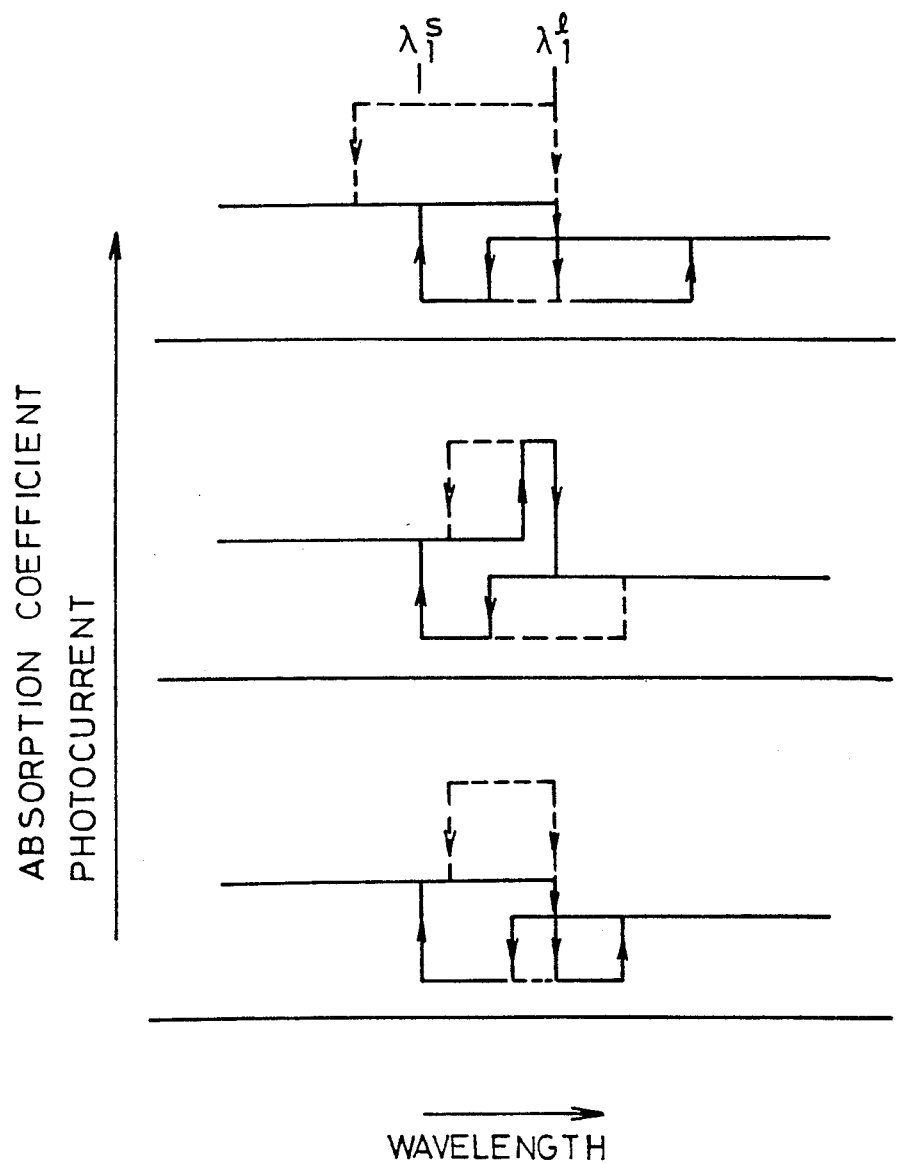

The wavelengths at which changes occur in the hysteresis loop can be electrically controlled. Thus, for different combinations of $\lambda_{1s}$, $\lambda_{1l}$, $\lambda_{2ws}$, $\lambda_{2wl}$, $\lambda_{2ss}$, and $\lambda_{2sl}$, various characteristics can be obtained. It should be noted, however, that the relationships, $\lambda_{1s} < \lambda_{1l}$, $\lambda_{2ws} < \lambda_{2wl}$, $\lambda_{2ss} < \lambda_{2sl}$, $\lambda_{2ws} < \lambda_{2ss}$, and $\lambda_{2wl} < \lambda_{2sl}$, must be satisfied. That is, 23 combinations shown in FIGS. 8-30 besides that of FIG. 5(f) may be possible. FIGS. 8-30 show only those cases in which $I_{2wl} > I_{2sl}$. However, there may be cases in which $I_{2wh} < I_{2sl}$, which may provide a characteristic such as shown in FIG. 31. The relationship in the location of the wavelengths at which changes occur in the hysteresis loop is similar to that of the characteristics shown in FIG. 5(f). Other than the one shown in FIG. 31, eight characteristics as shown in FIGS. 32 and 33 may be obtained. The relationships in location of the wavelengths at which changes occur in the hysteresis loops shown in FIGS. 32 and 33 are similar to those of the characteristics shown in FIGS. 14, 15, 16, 17, 21, 22, 24, and 28, respectively.

It is seen that the optical multi-stable device shown in FIG. 4 can exhibit thirty-three (33) characteristics in total.

Example 2

The above-described Example 1 is an optical multi-stable device comprising two serially disposed p-i-n photodiodes. A larger number of optical multi-stability characteristics can be obtained if three or more p-i-n photodiodes are connected in series.

These examples can also exhibit a number of optical multi-stable output-light-intensity versus incident-light-intensity characteristics.

Example 3

In Examples 1 and 2, two or more discrete p-i-n diodes are connected optically in series.

Figure 34:
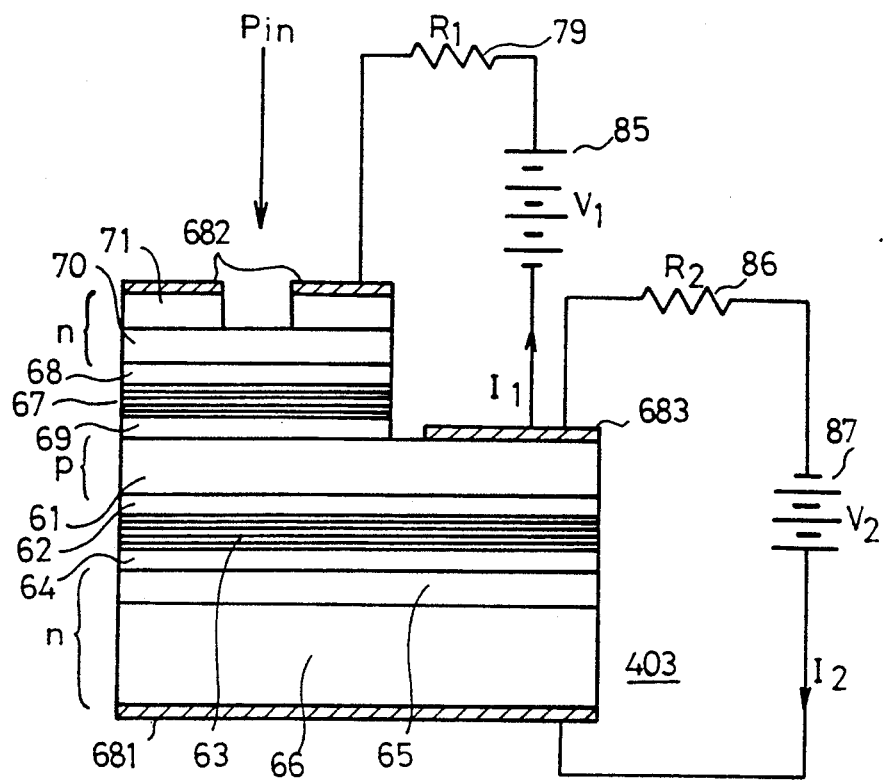
FIG. 34 shows an optical multi-stable device according to another embodiment of the present invention.

An optical multi-stable device 403 shown in FIG. 34 is a monolithic integrated device which comprises an output p-i-n photodiode section including a p-type AlGaAs layer 61, an undoped AlGaAs layer 62, an AlGaAs/GaAs multiple quantum well layer 63, an undoped AlGaAs layer 64, an n-type AlGaAs layer 65, and an n-type GaAs layer 66, and an n-i-p input photodiode section disposed on the output p-i-n photodiode section. The n-i-p input side photodiode section comprises an AlGaAs/GaAs multiple quantum well layer 67, undoped AlGaAs layers 68 and 69 disposed on the opposed surfaces of the layer 67, an n-type AlGaAs layer 70 disposed on the undoped AlGaAs layer 69, and an n-type CaAs layer 71 disposed on the surface of the n-type AlGaAs layer 70 except the portion where input light is incident.

An electrode 681 is disposed on the n-type GaAs layer 66, an electrode 682 is disposed on the n-type GaAs layer 71, and an electrode 683 is disposed on the p-type AlGaAs layer 61. A source 85 providing a voltage $V_1$ is connected via a resistor 79 having a resistance value $R_1$ between the electrodes 682 and 683 to provide a reverse bias to the n-i-p input side photodiode section comprising the layers 71, 70, 68, 67, 69 and 61. A source 87 providing a voltage $V_2$ is connected via a resistor 86 having a resistance value of $R_2$ between the electrodes 681 and 683 to provide a reverse bias to the output side p-i-n photodiode section comprising layers 61-66.

Light having an intensity $P_{in}$ is incident on the n-i-p input side photodiode section, and, in response to the incident light, photocurrent $I_1$ flows through the resistor 79. In response to light transmitted through the input side photodiode section to the output side photodiode section, photocurrent $I_2$ flows through the resistor 86.

Also, in this optical multi-stable device 403, by appropriately choosing the values of the resistors 79 and 86, a variety of multi-stability characteristics for photocurrent response or light absorption coefficients for wavelength and intensity of input light can be obtained.

Example 4

Figure 1:
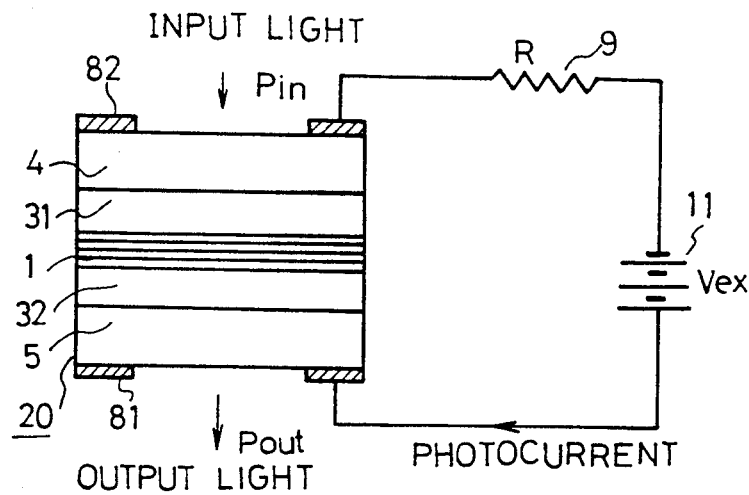
FIG. 1 shows a conventional optical bistable element including a p-i-n photodiode.
Figure 2:
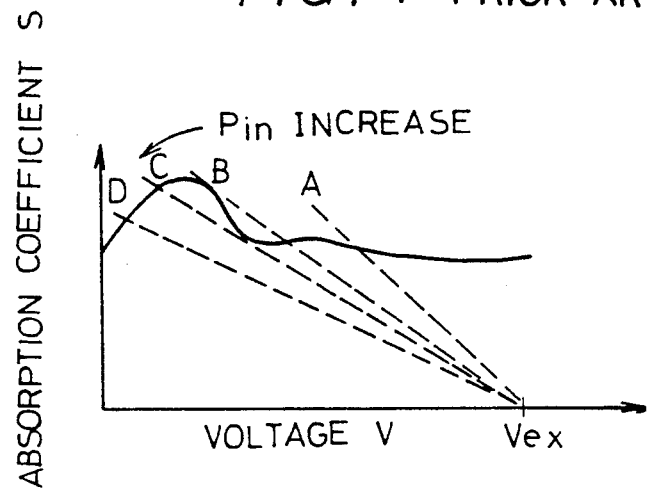
FIG. 2 is a diagram showing a light absorbing characteristic of the conventional optical bistable element shown in FIG. 1.
Figure 3:
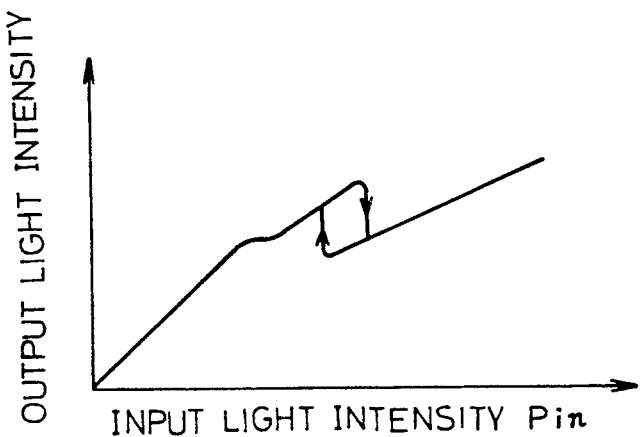
FIG. 3 is a characteristic diagram showing the relationship between input and output light intensities of the element shown in FIG. 1.
Figure 35:
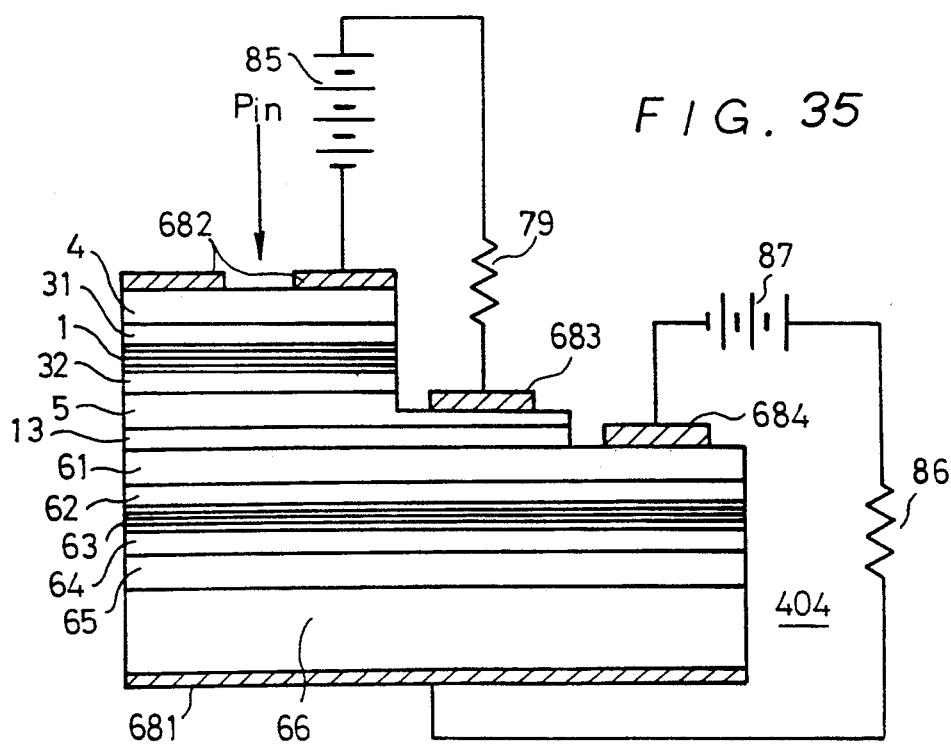
FIG. 35 shows an optical multi-stable device according to still another embodiment of the present invention.

An optical multi-stable device 404 shown in FIG. 35 is a monolithic integrated device which comprises a combination of the p-i-n photodiode section including the layers 61-66 shown in FIG. 34, an undoped AlGaAs layer 13 disposed on this p-i-n photodiode section, and a photodiode similar to the conventional p-i-n photodiode 20 shown in FIG. 1 which comprises layers 4, 31, 1, 32 and 5. The input side p-i-n photodiode and the output side photodiode comprising the layers 61-66 are electrically separated from each other by the undoped AlGaAs layer 13.

An electrode 683 is disposed on the n-type AlGaAs layer 5, and an electrode 682 is disposed on the layer 4. A voltage source 85 is connected through a resistor 79 between the electrodes 683 and 682 to provide a reverse bias to the input side p-i-n diode. An electrode 684 is disposed on the p-type AlGaAs layer 66, and an electrode 681 is disposed on the layer 66. A voltage source 87 is connected through a resistor 86 between the electrodes 684 and 681 to provide a reverse bias to the p-i-n photodiode comprising the layers 61-66.

This optical multi-stable device 404, too, can exhibit a variety of optical multi-stability characteristics for photocurrents or light absorption coefficients versus wavelength and intensity of input light, depending on the selection of the values of the resistors 79 and 86.

Example 5

In place of conventional multiple quantum well elements in the above-described examples, elements having an asymmetric double quantum well structure or coupled quantum well structure can be used to realize similar optical multi-stable devices.

Example 6

In the above-described examples, resistors having a linear characteristic are used as the external series resistors, but elements having a non-linear characteristic, such as diodes and transistors, may be used instead.

According to the present invention, as fully described in the above, a resistor is connected in series with a diode including a light absorbing layer with a quantum well structure so that a voltage drop is developed across the resistor due to photocurrent generated in response to incident light, whereby the diode with the series resistor exhibits an optical bistable characteristic. A plurality of such combinations are disposed optically in series so that a variety of optical multi-stable characteristics for incident light wavelengths or incident light intensities, can be obtained.

What is claimed is:

1. A method of selective light detection comprising:
   providing a first p-i-n diode having p-type, intrinsic, and n-type layers, the intrinsic layer including a multiple quantum well structure;
   connecting a first external resistor and a first voltage supply in series with the first p-i-n diode to apply a reverse bias voltage to the first p-i-n diode;
   selecting at least one of the resistance of the first external resistor and the reverse bias voltage applied by the first voltage supply to produce first and second stable photocurrents flowing through the first p-i-n diode at different wavelengths of light serially incident on the p-type, intrinsic, and n-type layers of the first p-i-n diode;
   providing a second p-i-n diode in optically serial disposition with the first diode, the second p-i-n diode having p-type, intrinsic, and n-type layers, the intrinsic layer including a multiple quantum well structure;
   connecting a second external resistor and a second voltage supply in series with the second p-i-n diode to apply a reverse bias voltage to the second p-i-n diode;
   selecting at least one of the resistance of the second external resistor and the reverse bias voltage applied by the second voltage supply to produce third and fourth stable photocurrents flowing through the second p-i-n diode at different wavelengths of light serially incident on the p-type, intrinsic, and n-type layers of the second p-i-n diode, the third and fourth photocurrents having magnitudes that depend upon the intensity of the light incident serially on the p-type, intrinsic, and n-type layers of the second p-i-n diode; and
   directing light incident on and transmitted through the first p-i-n diode onto the second p-i-n diode to produce a response characteristic in the second p-i-n diode having four stable photocurrents at respective wavelengths of light incident on the first p-i-n diode.

2. A method of selective light detection comprising:
   providing a multiple layer semiconductor structure including a first n-type layer, a first intrinsic layer, a first p-type layer, a second intrinsic layer, and a second n-type layer serially and successively disposed, the first and second intrinsic layers each including a multiple quantum well structure;
   connecting a first external resistor and a first voltage supply in series with the first n-type, first intrinsic, and first p-type layers to apply a reverse bias voltage to those layers;
   selecting at least one of the resistance of the first external resistor and the reverse bias voltage applied by the first voltage supply to produce first and second stable photocurrents flowing through the first n-type, first intrinsic, and first p-type layers at different wavelengths of light serially incident on the first n-type, first intrinsic, and first p-type layers;
   connecting a second external resistor and a second voltage supply in series with the first p-type, second intrinsic, and second n-type layers to apply a reverse bias voltage to those layers;
   selecting at least one of the resistance of the second external resistor and the reverse bias voltage applied by the second voltage supply to produce third and fourth stable photocurrents flowing through the first p-type, second intrinsic, and second n-type layers at different wavelengths of light serially incident on the first p-type, second intrinsic, and second n-type layers, the third and fourth photocurrents having magnitudes that depend upon the intensity of the light incident serially on the first p-type, second intrinsic, and second n-type layers; and
   directing light incident on and transmitted through the first n-type layer and first intrinsic layer to the first p-type layer, second intrinsic layer, and second n-type layer to produce a response characteristic in the first p-type, second intrinsic, and second n-type layers having four stable photocurrents at respective wavelengths of light incident on the first n-type layer.

3. A method of selective light detection comprising:
   providing a multiple layer semiconductor structure including a first p-type layer, a first intrinsic layer, a first n-type layer, a second intrinsic layer, a second p-type layer, a third intrinsic layer, and a second n-type layer serially and successively disposed, the first and third intrinsic layers each including a multiple quantum well structure;
   connecting a first external resistor and a first voltage supply in series with the first p-type, first intrinsic, and first n-type layers to apply a reverse bias voltage to those layers;
   selecting at least one of the resistance of the first external resistor and the reverse bias voltage applied by the first voltage supply to produce first and second stable photocurrents flowing through the first p-type, first intrinsic, and first n-type layers at different wavelengths of light serially incident on the first p-type, first intrinsic, and first n-type layers;
   connecting a second external resistor and a second voltage supply in series with the second p-type, third intrinsic, and second n-type layers to apply a reverse bias voltage to those layers;
   selecting at least one of the resistance of the second external resistor and the reverse bias voltage applied by the second voltage supply to produce third and fourth stable photocurrents flowing through the second p-type, third intrinsic, and second n-type layers at different wavelengths of light serially incident on the second p-type, third intrinsic, and second n-type layers, the third and fourth photocurrents having magnitudes that depend upon the intensity of the light incident serially on the second p-type, third intrinsic, and second n-type layers; and directing light incident on and transmitted through the first p-type, first intrinsic, first n-type, and second intrinsic layers to the second p-type layer, third intrinsic layer, and second n-type layer to produce a response characteristic in the second p-type, third intrinsic, and second n-type layers having four stable photocurrents at respective wavelengths of light incident on the first p-type layer.

4. A method of selective light detection comprising:

providing a first p-i-n diode having p-type, intrinsic, and n-type layers, the intrinsic layer including a multiple quantum well structure;

connecting a first external resistor and a first voltage supply in series with the first p-i-n diode to apply a reverse bias voltage to the first p-i-n diode;

selecting at least one of the resistance of the first external resistor and the reverse bias voltage applied by the first voltage supply to produce first and second stable photocurrents flowing through the first p-i-n diode within a first range of wavelengths of light serially incident on the p-type, intrinsic, and n-type layers of the first p-i-n diode;

providing a second p-i-n diode in optically serial disposition with the first diode, the second p-i-n diode having p-type, intrinsic, and n-type layers, the intrinsic layer including a multiple quantum well structure;

connecting a second external resistor and a second voltage supply in series with the second p-i-n diode to apply a reverse bias voltage to the second p-i-n diode;

selecting at least one of the resistance of the second external resistor and the reverse bias voltage applied by the second voltage supply to produce third and fourth stable photocurrents flowing through the second p-i-n diode within a second range of wavelengths of light serially incident on the p-type, intrinsic, and n-type layers of the second p-i-n diode, the third and fourth photocurrents having magnitudes that depend upon the intensity of the light incident serially on the p-type, intrinsic, and n-type layers of the second p-i-n diode; and directing light incident on and transmitted through the first p-i-n diode onto the second p-i-n diode to produce a response characteristic in the second p-i-n diode having four stable photocurrents at respective wavelengths of light incident on the first p-i-n diode.

5. The method of claim 4 wherein the third range of wavelengths encompasses the first and second ranges of wavelengths.

6. A method of selective light detection comprising:

providing a multiple layer semiconductor structure including a first n-type layer, a first intrinsic layer, a first p-type layer, a second intrinsic layer, and a second n-type layer serially and successively disposed, the first and second intrinsic layers each including a multiple quantum well structure;

connecting a first external resistor and a first voltage supply in series with the first n-type, first intrinsic, and first p-type layers to apply a reverse bias voltage to those layers;

selecting at least one of the resistance of the first external resistor and the reverse bias voltage applied by the first voltage supply to produce first and second stable photocurrents flowing through the first n-type, first intrinsic, and first p-type layers within a first range of wavelengths of light serially incident on the first n-type, first intrinsic, and first p-type layers;

connecting a second external resistor and a second voltage supply in series with the first p-type, second intrinsic, and second n-type layers to apply a reverse bias voltage to those layers;

selecting at least one of the resistance of the second external resistor and the reverse bias voltage applied by the second voltage supply to produce third and fourth stable photocurrents flowing through the first p-type, second intrinsic, and second n-type layers within a second range of wavelengths of light serially incident on the first p-type, second intrinsic, and second n-type layers, the third and fourth photocurrents having magnitudes that depend upon the intensity of the light incident serially on the first p-type, second intrinsic, and second n-type layers; and directing light incident on and transmitted through the first n-type layer and first intrinsic layer to the first p-type layer, second intrinsic layer, and second n-type layer to produce a response characteristic in the first p-type, second intrinsic, and second n-type layers having four stable photocurrents within a third range of wavelengths of light incident on the first n-type layer.

7. The method of claim 6 wherein the third range of wavelengths encompasses the first and second ranges of wavelengths.

8. A method of selective light detection comprising:

providing a multiple layer semiconductor structure including a first p-type layer, a first intrinsic layer, a first n-type layer, a second intrinsic layer, a second p-type layer, a third intrinsic layer, and a second n-type layer serially and successively disposed, the first and third intrinsic layers each including a multiple quantum well structure;

connecting a first external resistor and a first voltage supply in series with the first p-type, first intrinsic, and first n-type layers to apply a reverse bias voltage to those layers;

selecting at least one of the resistance of the first external resistor and the reverse bias voltage applied by the first voltage supply to produce first and second stable photocurrents flowing through the first p-type, first intrinsic, and first n-type layers within a first range of wavelengths of light serially incident on the first p-type, first intrinsic, and first n-type layers;

connecting a second external resistor and a second voltage supply in series with the first p-type, second intrinsic, and second n-type layers to apply a reverse bias voltage to those layers;

selecting at least one of the resistance of the second external resistor and the reverse bias voltage applied by the second voltage supply to produce third and fourth stable photocurrents flowing through the first p-type, third intrinsic, and second n-type layers within a second range of wavelengths of light serially incident on the second p-type, third intrinsic, and second n-type layers, the third and fourth photocurrents having magnitudes that depend upon the intensity of the light incident serially on the second p-type, third intrinsic, and second n-type layers; and directing light incident on and transmitted through the first p-type, first intrinsic, first n-type, and second intrinsic layers to the second p-type layer, third intrinsic layer, and second n-type layer to produce a response characteristic in the second p-type, third intrinsic, and second n-type layers having four stable photocurrents within a third range of wavelengths of light incident on the first p-type layer.

9. The method of claim 8 wherein the third range of wavelengths encompasses the first and second ranges of wavelengths.

* * * * *